United States Patent
Takeuchi

(10) Patent No.: US 12,464,758 B2
(45) Date of Patent: Nov. 4, 2025

(54) SEMICONDUCTOR DEVICE AND ELECTRONIC DEVICE

(71) Applicant: SONY SEMICONDUCTOR SOLUTIONS CORPORATION, Kanagawa (JP)

(72) Inventor: Katsuhiko Takeuchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 702 days.

(21) Appl. No.: 17/755,639

(22) PCT Filed: Oct. 15, 2020

(86) PCT No.: PCT/JP2020/038905
§ 371 (c)(1),
(2) Date: May 4, 2022

(87) PCT Pub. No.: WO2021/095433
PCT Pub. Date: May 20, 2021

(65) Prior Publication Data
US 2022/0352362 A1 Nov. 3, 2022

(30) Foreign Application Priority Data
Nov. 12, 2019 (JP) .................. 2019-204602

(51) Int. Cl.
*H10D 30/47* (2025.01)
*H10D 1/47* (2025.01)
*H10D 84/80* (2025.01)

(52) U.S. Cl.
CPC ............. *H10D 30/475* (2025.01); *H10D 1/47* (2025.01); *H10D 84/811* (2025.01)

(58) Field of Classification Search
CPC . H01L 27/0629; H01L 28/20; H01L 27/0685; H10D 30/475; H10D 1/47;
(Continued)

(56) References Cited

U.S. PATENT DOCUMENTS

2014/0098585 A1* 4/2014 Ikeda .................. H01L 27/0629
257/195
2015/0287713 A1 10/2015 Morita
2017/0229445 A1 8/2017 Maehara et al.

FOREIGN PATENT DOCUMENTS

CN 107046030 A 8/2017
DE 102017200557 A1 8/2017
(Continued)

OTHER PUBLICATIONS

International Search Report and Written Opinion of PCT Application No. PCT/JP2020/038905, issued on Jan. 12, 2021, 12 pages of ISRWO.

*Primary Examiner* — Thanhha S Pham
(74) *Attorney, Agent, or Firm* — CHIP LAW GROUP

(57) ABSTRACT

A semiconductor device includes: a semiconductor material layer forming a channel layer; a pair of source/drain electrodes formed on the semiconductor material layer; and a gate electrode arranged between the pair of source/drain electrodes and formed on the semiconductor material layer, at least one of the pair of source/drain electrodes and the gate electrode being connected via a resistive element.

12 Claims, 19 Drawing Sheets

(58) Field of Classification Search
CPC ...... H10D 84/811; H10D 30/60; H10D 30/67; H10D 30/015; H10D 62/8503
See application file for complete search history.

(56) References Cited

FOREIGN PATENT DOCUMENTS

| | | |
|---|---|---|
| JP | 58-123769 A | 7/1983 |
| JP | 61-160963 A | 7/1986 |
| JP | 2001-284579 A | 10/2001 |
| JP | 2007-305747 A | 11/2007 |
| JP | 2014-078570 A | 5/2014 |
| JP | 2017-143127 A | 8/2017 |
| JP | 2018-067730 A | 4/2018 |
| WO | 2014/103126 A1 | 7/2014 |

\* cited by examiner

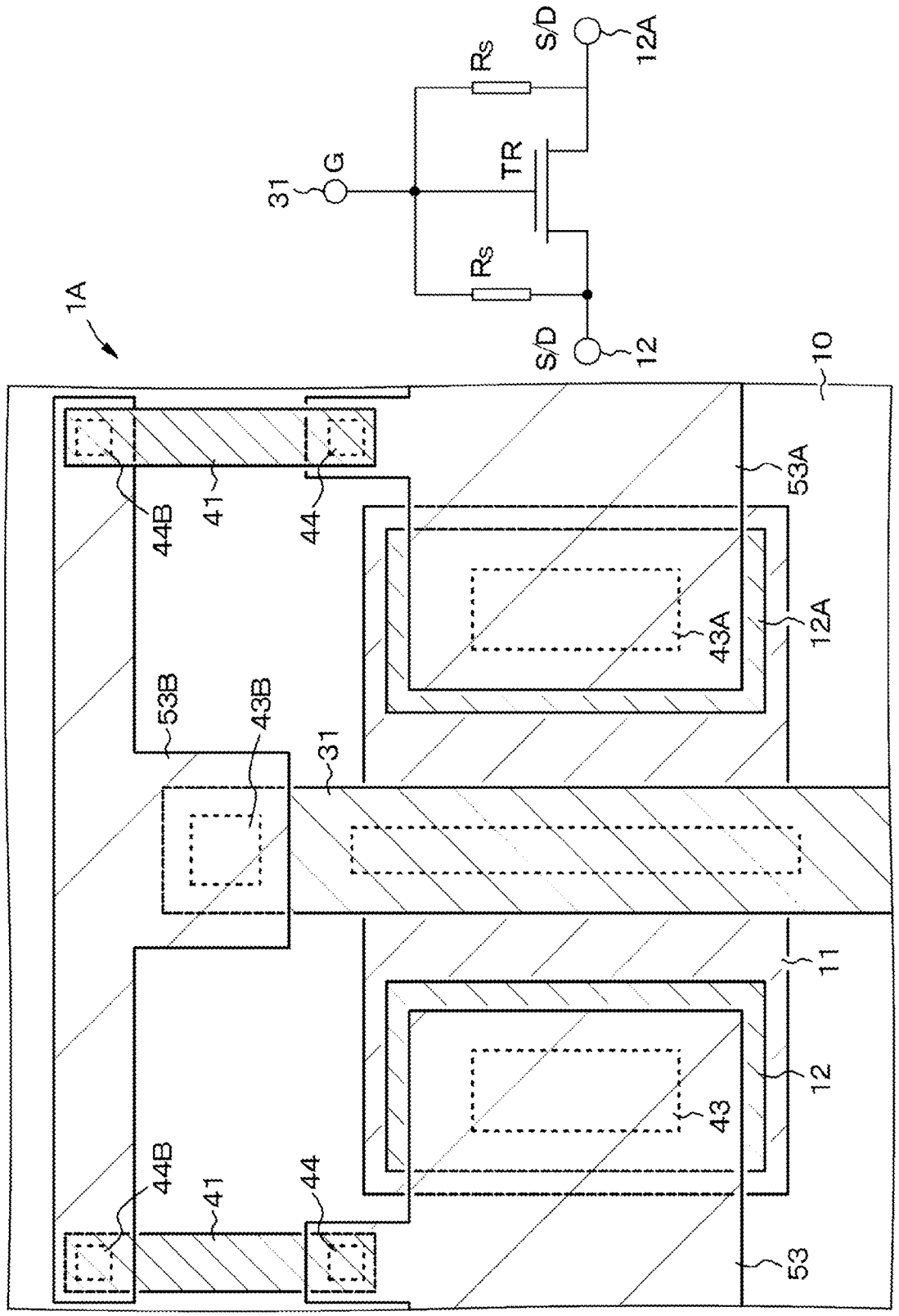

SEMICONDUCTOR DEVICE AND ELECTRONIC DEVICE

CROSS REFERENCE TO RELATED APPLICATIONS

This application is a U.S. National Phase of International Patent Application No PCT/JP2020/038905 filed on Oct. 15, 2020, which claims priority benefit of Japanese Patent Application No. JP 2019-204602 filed in the Japan Patent Office on Nov. 12, 2019. Each of the above-referenced applications is hereby incorporated herein by reference in its entirety.

FIELD

The present disclosure relates to a semiconductor device and an electronic device.

BACKGROUND

Gallium nitride (GaN), which is a wide-gap semiconductor material, has characteristics that a breakdown voltage is high, a high-temperature operation is possible, and a saturation drift speed is high. In addition, a two-dimensional electron gas (2DEG) formed in a GaN-based heterojunction has characteristics of a high mobility and a high sheet electron density. Due to these characteristics, a GaN-based hetero-FET can perform a low-resistance, high-speed, and high-withstand voltage operation, and thus, is expected to be applied to a power device, an RF device, and the like.

In the case of a general GaN-based hetero-FET (HFET), a barrier layer is arranged on a GaN layer forming a channel layer. As a material of the barrier layer, $Al_{1-x-y}Ga_xIn_yN$ (where $0 \leq x < 1$, $0 \leq y < 1$) or the like is generally used in order to generate 2DEG by polarization occurring between the barrier layer, and the channel layer. A composition is appropriately selected such that favorable characteristics can be achieved, but it is generally known that a leakage current in a Schottky junction formed between a gate electrode and the barrier layer increases depending on the composition. In such a case, the leakage current can be reduced by arranging the gate electrode via a gate insulating film.

In a manufacturing step such as etching using plasma in a manufacturing process of a semiconductor device, a phenomenon called plasma induced damage (PID) occurs in which damage is caused by charge charged in a conductor layer wiring. For this reason, it has been proposed that a low withstand voltage capacitor is connected to a gate electrode to release charge charged by dielectric breakdown of the low withstand voltage capacitor (see, for example, Patent Literature 1).

CITATION LIST

Patent Literature

Patent Literature 1: JP 2001-284579 A

SUMMARY

Technical Problem

In a semiconductor device in which the charged charge is released by the dielectric breakdown of the low withstand voltage capacitor, it is necessary to remove a wiring connecting the capacitor before shipment of the semiconductor device. in this case, however, a process step of removing the wiring is required, which causes an increase in cost.

Therefore, an object of the present disclosure is to provide a semiconductor device, which can reduce PID in a manufacturing step such as etching using plasma and does not require a process step of removing a wiring before shipment of the semiconductor device, and an electronic device including the semiconductor device.

Solution to Problem

A semiconductor device according to the present disclosure for achieving the above objective includes: a semiconductor material layer forming a channel layer; a pair of source/drain electrodes formed on the semiconductor material layer; and a gate electrode arranged between the pair of source/drain electrodes and formed on the semiconductor material layer, wherein at least one of the pair of source/drain electrodes and the gate electrode are connected via a resistive element.

An electronic device according to the present disclosure for achieving the above objective includes a semiconductor device including: a semiconductor material layer forming a channel layer; a pair of source/drain electrodes formed on the semiconductor material layer; and a gate electrode arranged between the pair of source/drain electrodes and formed on the semiconductor material layer, wherein at least one of the pair of source/drain electrodes and the gate electrode being connected via a resistive element.

BRIEF DESCRIPTION OF DRAWINGS

FIG. 14 is a schematic partial plan view for describing a configuration of a semiconductor device according to a first modification of the first embodiment of the present disclosure.

DESCRIPTION OF EMBODIMENTS

Figure 1:
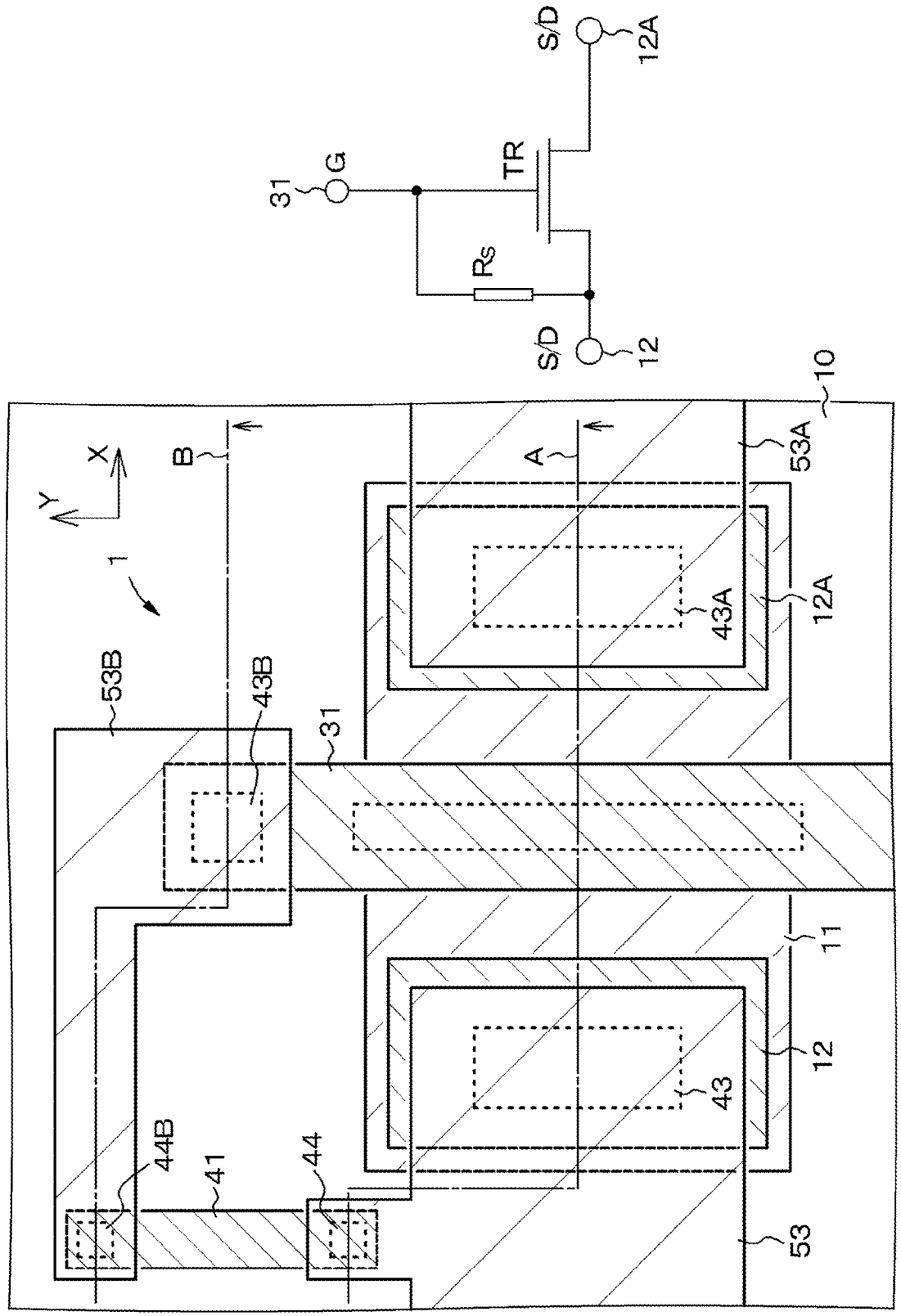
FIG. 1 is a schematic partial plan view for describing a configuration of a semiconductor device according to a first embodiment of the present disclosure.

Hereinafter, the present disclosure will be described based on embodiments with reference to the drawings. The present disclosure is not limited to the embodiments, and various numerical values and materials in the embodiments are given as examples. In the following description, the same reference signs will be used for the same elements or elements having the same functions, and redundant descriptions thereof will be omitted. Note that the description will be given in the following order.

1. Overall description of Semiconductor Device, Method of Manufacturing Semiconductor Device, and Electronic Device, According to Present Disclosure
2. First Embodiment
3. First Modification
4. Second Modification
5. Third Modification
6. Description of Electronic Device
7. Application Examples
8. Others

[Overall Description of Semiconductor Device, Method of Manufacturing Semiconductor Device, and Electronic Device, According to Present Disclosure]

In the following description, a semiconductor device according to the present disclosure, a semiconductor device manufactured by a method of manufacturing a semiconductor device according to the present disclosure, and a semiconductor device provided in an electronic device according to the present disclosure are sometimes simply referred to as a [semiconductor device of the present disclosure].

As described above, the semiconductor device of the present disclosure is a semiconductor device including:
a semiconductor material layer forming a channel layer;
a pair of source/drain electrodes formed on the semiconductor material layer; and
a gate electrode arranged between the pair of source/drain electrodes and formed on the semiconductor material layer,
at least one of the pair of source/drain electrodes and the gate electrode being connected via a resistive element.

Then, the semiconductor device of the present disclosure can adopt a configuration in which the gate electrode is formed on the semiconductor material layer via a gate insulating film. In this case, it is possible to adopt a configuration in which the semiconductor material layer has a barrier layer formed on the channel layer. In addition, it is possible to adopt a configuration in which the semiconductor material layer is made of a compound semiconductor material, and is formed using, for example, gallium nitride (GaN), gallium arsenide (GaAs), or the like. Note that it is possible to adopt a configuration in which the semiconductor material layer is formed using silicon (Si) in some cases.

In the semiconductor device of the present disclosure having the above-described various preferred configurations, the semiconductor material layer forming the channel layer can be configured to be formed such that a two-dimensional electron gas layer exists in the channel layer under the gate electrode in a state where no voltage is applied to the pair of source/drain electrodes and the gate electrode.

In this case, the semiconductor device has a normally-on configuration. Therefore, a sufficient effect on PID can be obtained by connecting one of the pair of source/drain electrodes and the gate electrode via the resistive element. Note that it is preferable to adopt a configuration in which both the pair of source/drain electrodes are connected to the gate electrode via the resistive element in a case where the semiconductor device has a normally-off configuration.

In the semiconductor device of the present disclosure having the above-described various preferred configurations, an impedance of the resistive element can be configured to be larger than an internal impedance between the source/drain electrode and the gate electrode to which the resistive element is connected. In this case, the impedance of the resistive element can be configured to be 1 kΩ or more, and more preferably, the impedance of the resistive element is desirably configured to be 1 MΩ or more.

In the semiconductor device of the present disclosure having the above-described various preferred configurations, the resistive element can be configured to be arranged in an interlayer film formed on the semiconductor material layer. In this case, a material forming the resistive element is not particularly limited. For example, the resistive element can be formed using a metal material, which has been made thin so as to obtain a predetermined resistance value, polysilicon, or the like.

Alternatively, in this case, it is also possible to adopt an aspect in which the resistive element is formed using a semiconductor material layer formed in the same layer as the semiconductor material layer forming the channel layer. For example, the resistive element can be formed using a semiconductor material layer whose shape is defined by an element isolation region.

In the semiconductor device of the present disclosure having the above-described various preferred configurations, it is possible to adopt a configuration in which the semiconductor material layer is formed on a semiconductor substrate, and the source/drain electrode to which the resistive element is connected and the semiconductor substrate are connected. According to this configuration, a charge charged during a manufacturing process of the semiconductor device can be released to the semiconductor substrate side.

A material forming the semiconductor substrate is not particularly limited, and it is possible to use a material, for example, a group III-V compound semiconductor material, silicon carbide (SiC), sapphire, silicon (Si), or the like. Note that when lattice constants are different between the semiconductor substrate and the semiconductor material layer formed on the semiconductor substrate, the influence of the difference in the lattice constant can be reduced by providing a buffer layer therebetween.

The method of manufacturing a semiconductor device according to the present disclosure includes
a step of connecting at least one of a pair of source/drain electrodes and a gate electrode via a resistive element.

Examples of the electronic device including the semiconductor device of the present disclosure include a wireless communication device constituting a communication system and the like, and a semiconductor module such as an IC constituting the wireless communication device. As such a wireless communication device, one having a communication frequency of the ultra-high frequency (UHF) band or higher is particularly effective.

Various conditions in the present specification are satisfied when being not only strictly satisfied but also substantially satisfied in a mathematical manner. The presence of various variations caused in design or manufacturing is allowed. In addition, the respective drawings used in the following description are schematic, and do not illustrate actual dimensions or ratios thereof. For example, FIGS. 2A and 2B, which will be described later, illustrates a cross-sectional structure of the semiconductor device, but does not illustrate a ratio of a width, a height, a thickness, or the like.

First Embodiment

A first embodiment relates to a semiconductor device, a method of manufacturing a semiconductor device, and an electronic device according to the present disclosure.

FIG. 1 is a schematic partial plan view for describing a configuration of the semiconductor device according to the first embodiment of the present disclosure. More specifically, one of a large number of semiconductor devices formed on a wafer-like substrate. The same applies to the other drawings to be described later. Note that an equivalent circuit diagram of the semiconductor device is illustrated on the right side in FIG. 1.

A semiconductor device 1 according to the first embodiment includes
a semiconductor material layer 11 forming a channel layer,
a pair of source/drain electrodes 12 and 12A formed on the semiconductor material layer 11, and
a gate electrode 31 which is arranged between the pair of source/drain electrodes 12 and 12A and is formed on the semiconductor material layer 11. Note that planar shapes of the above-described components and the like are indicated by hatching in FIG. 1.

The semiconductor device 1 is a field effect transistor having an insulated gate structure. The gate electrode 31 is formed on the semiconductor material layer 11 via a gate insulating film, but the gate insulating film is not illustrated in FIG. 1 for convenience of illustration. The gate insulating film will be described in detail later with reference to FIGS. 2A and 2B to be described later.

In FIG. 1, reference sign 53 indicates a wiring connected to one source/drain electrode 12, and reference sign 43 indicates a contact connecting the wiring and the one source/drain electrode 12. Reference sign 53A indicates a wiring connected to the other source/drain electrode 12A, and reference sign 43A indicates a contact connecting the wiring and the other source/drain electrode 12A. Reference sign 53B indicates a wiring connected to the gate electrode 31, and reference sign 43B indicates a contact connecting the wiring and the gate electrode 31. The wirings 53, 53A, and 53B are formed by patterning conductive material layers formed in the same layer.

Then, at least one of the pair of source/drain electrodes 12 and 12A (source/drain electrode 12 in the example illustrated in the drawing) and the gate electrode 31 are connected via a resistive element 41 (corresponding to reference sign $R_S$ in the equivalent circuit diagram). More specifically, the resistive element 41 is connected between the wiring 53 connected to the one source/drain electrode 12 and the wiring 53B connected to the gate electrode 31.

Figure 2A:
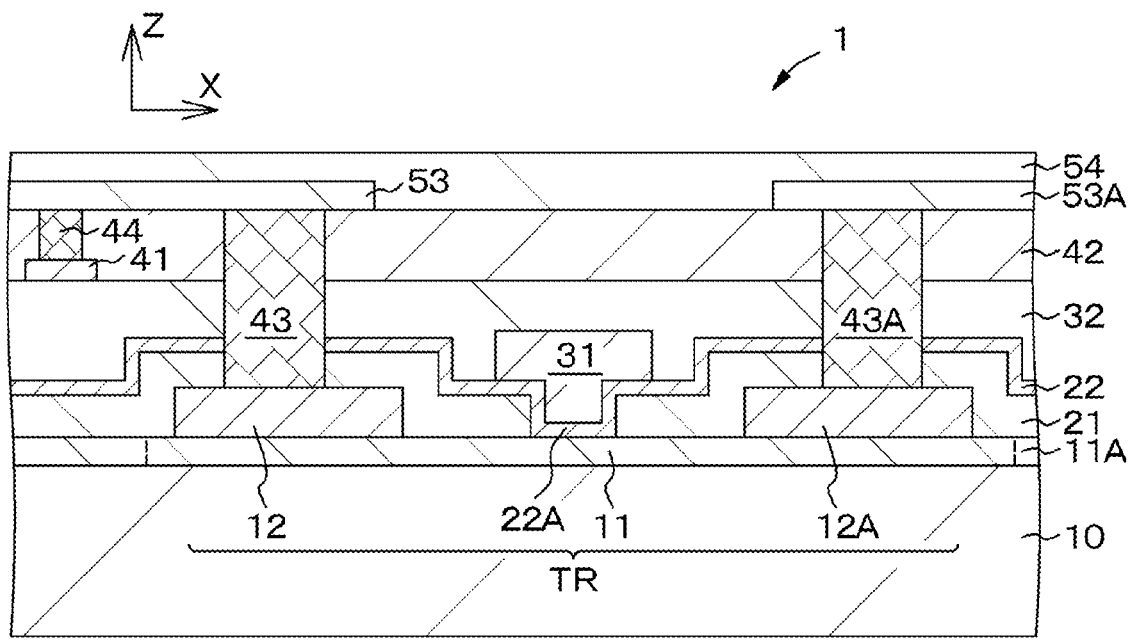
FIGS. 2A and 2B are schematic partial cross-sectional views for describing the configuration of the semiconductor device according to the first embodiment of the present disclosure.
Figure 2B:
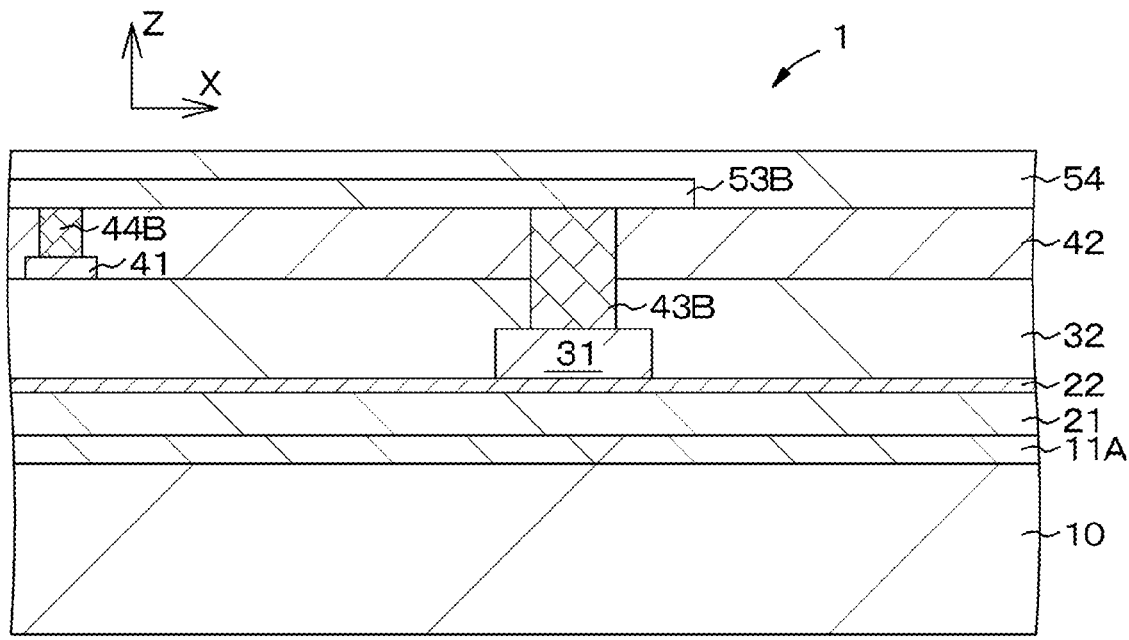

FIGS. 2A and 2B are schematic partial cross-sectional views for describing the configuration of the semiconductor device according to the first embodiment of the present disclosure. FIG. 2A schematically illustrates a cross section of a part denoted by reference sign A indicated by the alternate long and short dash line in FIG. 1. FIG. 2B schematically illustrates a cross section of a part denoted by reference sign B indicated by the alternate long and short dash line in FIG. 1. Note that the planar shape of each element will be described with reference to FIGS. 6 to 13 for describing the method of manufacturing a semiconductor device.

Figure 7:
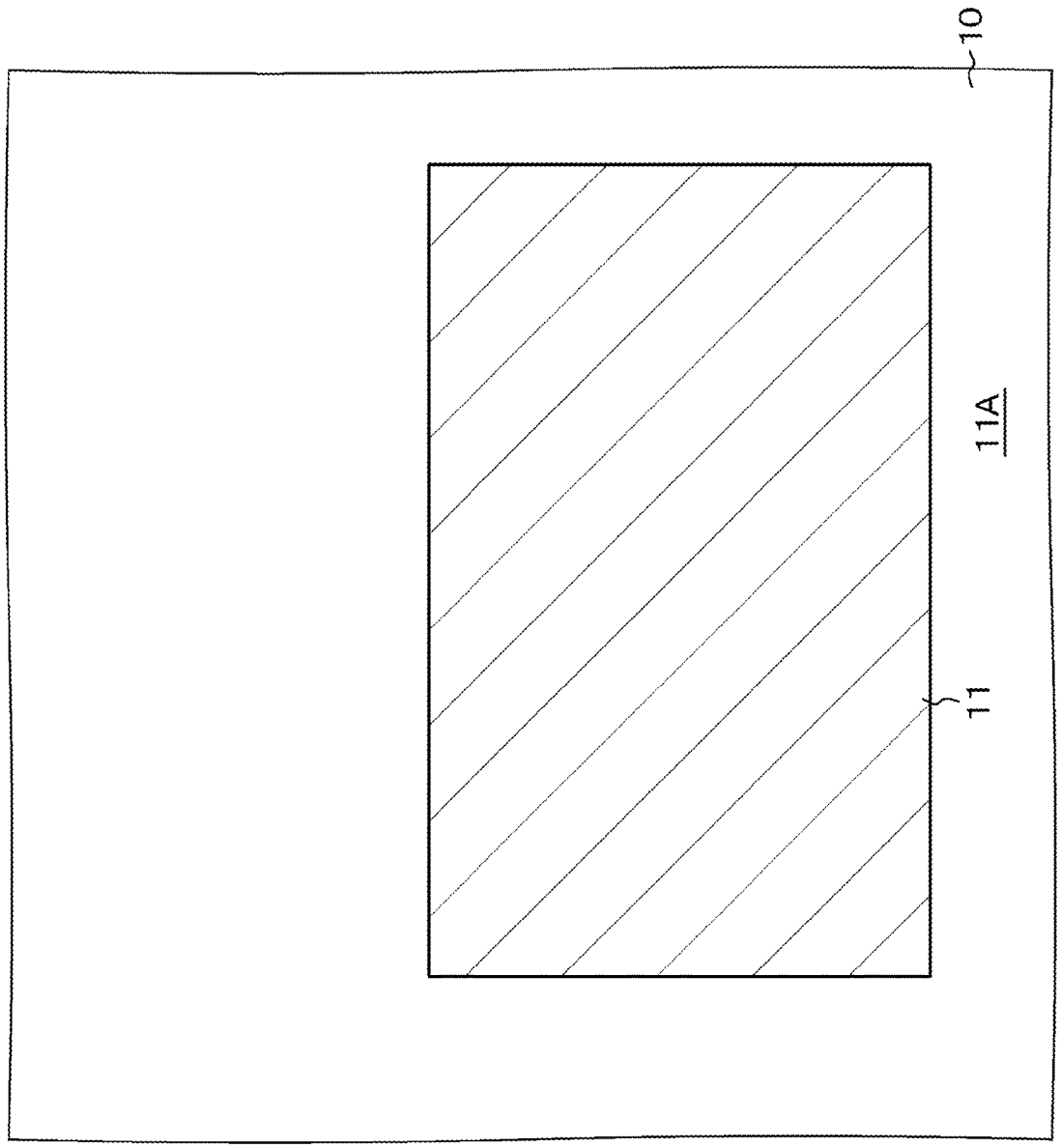
FIG. 7 is a schematic partial plan view for describing the method of manufacturing the semiconductor device according to the first embodiment of the present disclosure, which is continuous to FIG. 6.

The semiconductor device 1 is formed on a semiconductor substrate 10. The semiconductor material layer 11 forming the channel layer is formed on the semiconductor substrate 10. The semiconductor substrate 10 is made of, for example, a single crystal GaN substrate due to a relationship of a lattice constant with the semiconductor material layer 11 formed thereon. In FIG. 7, the hatched part illustrates the planar shape of the semiconductor material layer 11.

The semiconductor material layer 11 is made of a compound semiconductor material. For example, an epitaxial growth layer of gallium nitride (GaN) is used as the semiconductor material layer 11. The semiconductor material layer 11 is formed as a u-GaN layer to which no impurity is added. A barrier layer (not illustrated) is formed on the semiconductor material layer 11. As a material of the barrier layer, $Al_{1-x-y}Ga_xIn_yN$ (where $0 \leq x < 1$, $0 \leq y < 1$) or the like is generally used in order to generate 2DEG by polarization occurring between the barrier layer, and the semiconductor material layer 11. The semiconductor material layer 11 forming the channel layer is formed such that a two-dimensional electron gas layer exists in the channel layer under the gate electrode 31 in a state where no voltage is applied to the pair of source/drain electrodes 12 and 12A and the gate electrode 31.

Note that if the lattice constants of the material forming the semiconductor substrate 10 and the material forming the semiconductor material layer 11 are different, a buffer layer may be provided therebetween. As the lattice constants are controlled with the buffer layer, it is possible to improve a crystal state of the semiconductor material layer 11 and control the warp of the wafer-like substrate. For example, when the semiconductor substrate 1 is made of single crystal silicon, AlN, AlGaN, GaN, or the like is used as an example of such a buffer layer.

Figure 8:
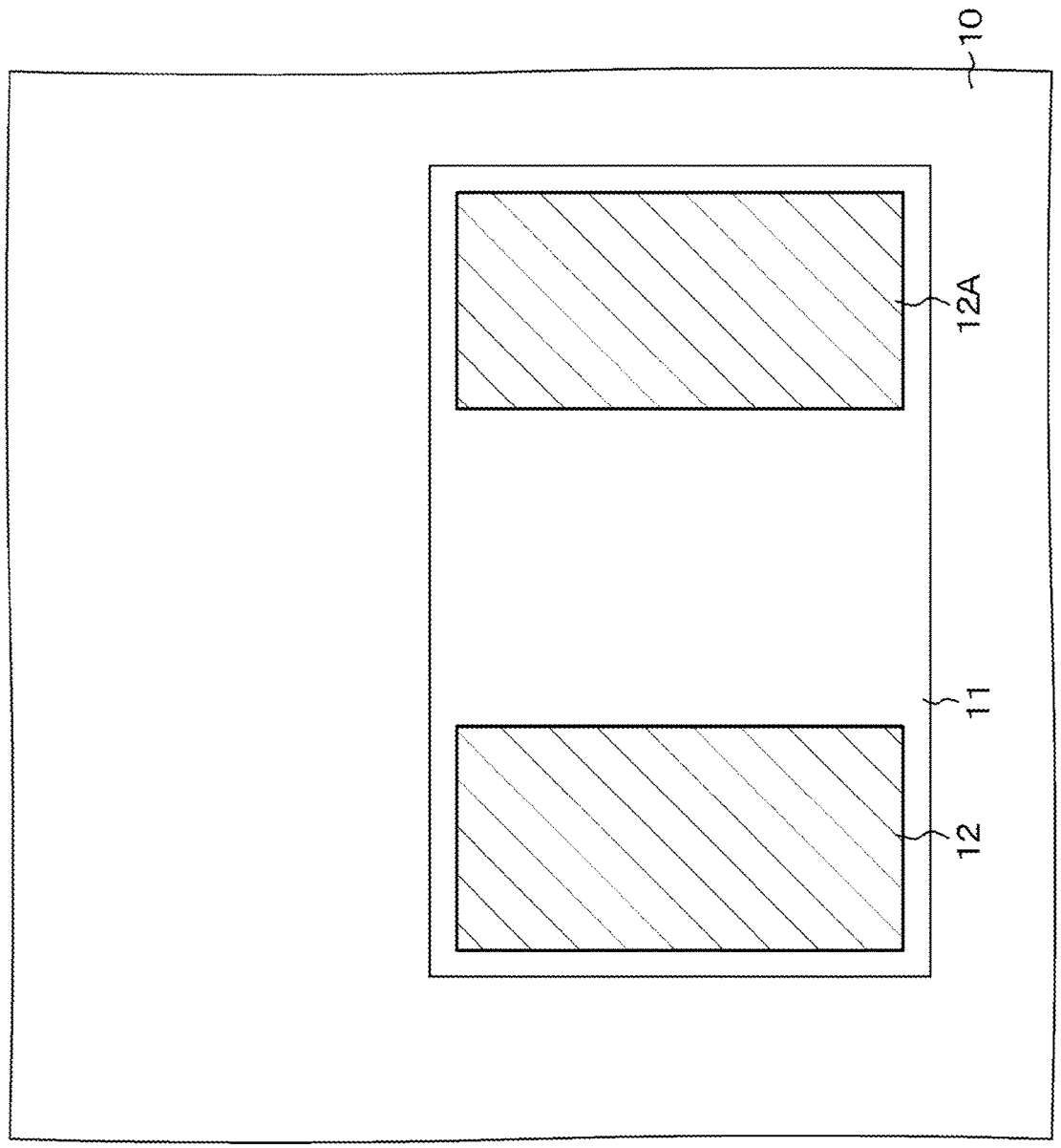
FIG. 8 is a schematic partial plan view for describing the method of manufacturing the semiconductor device according to the first embodiment of the present disclosure, which is continuous to FIG. 7.

As illustrated in FIG. 7, the planar shape of an active region of the semiconductor material layer 11 is substantially rectangular. As will be described later, a part surrounding the active region is set as an element isolation region by implanting boron ions (the part formed as the element isolation region is denoted by reference sign 11A). As illustrated in FIGS. 1, 2A, and 2B, the pair of source/drain electrodes 12 and 12A are formed on the semiconductor material layer 11. In FIG. 8, the hatched parts illustrate the planar shapes of the pair of source/drain electrodes 12 and 12A. The conductive material layer forming the source/drain electrodes 12 and 12A is made of a metal material, and is made of, for example, metal such as aluminum (Al), copper (Cu), titanium (Ti), nickel (Ni), gold (Au), or an alloy or the like containing these as a main component.

Note that annealing treatment may be performed as a means for achieving a low resistance. In addition, a high-concentration N+ layer may be formed between the semiconductor material layer 11 and the pair of source/drain electrodes 12 and 12A in order to further reduce the resistance. After etching the semiconductor material layer 11, the high-concentration N+ layer may be formed by selective regrowth for selective filling or may be formed by ion implantation. In the case of the selective regrowth, an n-$In_{1-x}Ga_xN$ layer or the like can be used.

As illustrated in FIGS. 2A and 2B, an interlayer insulating layer 21 is formed on the entire surface including the pair of source/drain electrodes 12 and 12A. As the material forming the interlayer insulating layer 21, a material, which has insulating properties with respect to the semiconductor material layer 11, forms a favorable interface, and does not degrade device characteristics, is appropriately selected and used.

Figure 9:
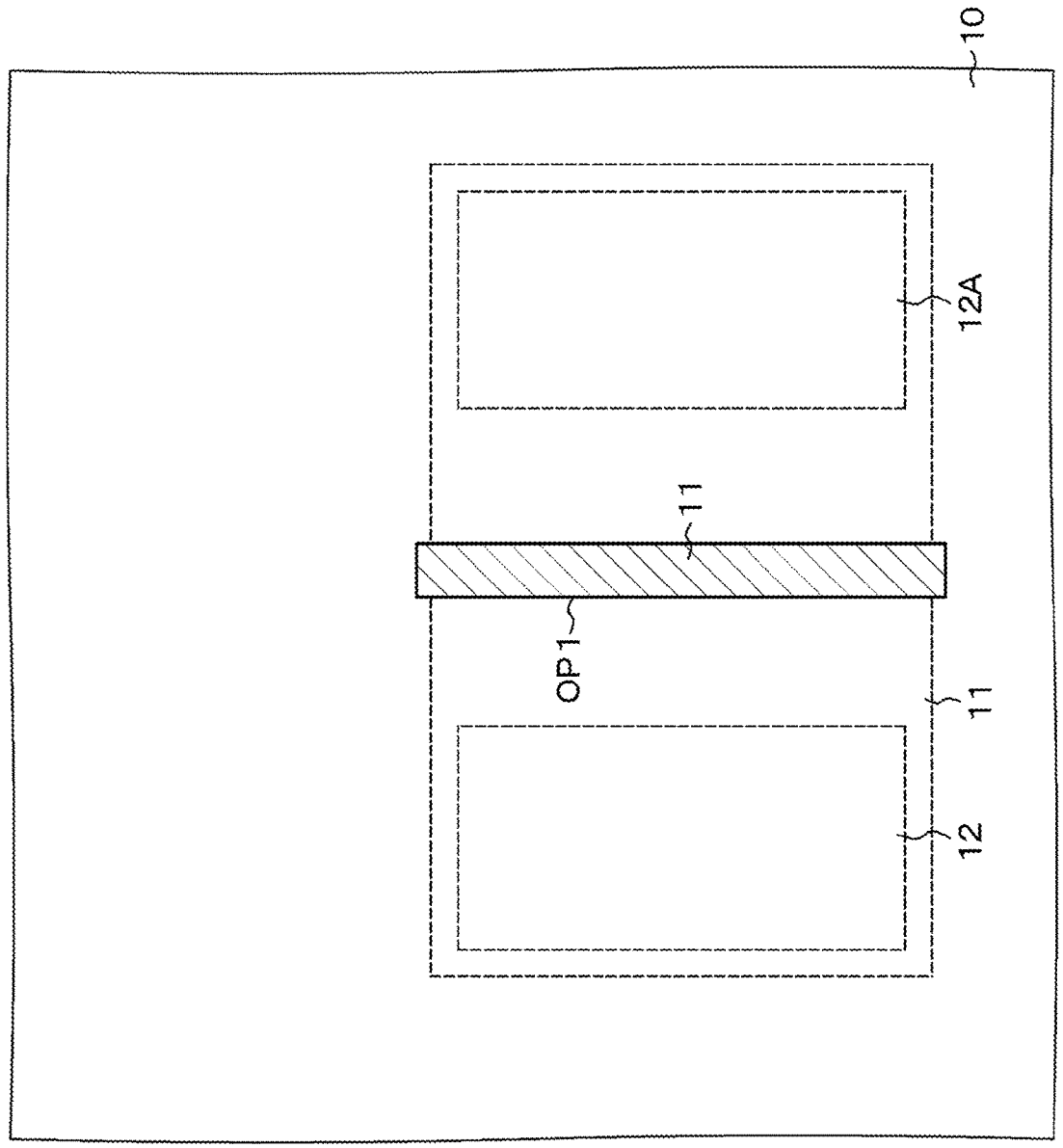
FIG. 9 is a schematic partial plan view for describing the method of manufacturing the semiconductor device according to the first embodiment of the present disclosure, which is continuous to FIG. 8.

As illustrated in FIG. 9, the interlayer insulating layer 21 is provided with an opening OP1 through which the semiconductor material layer 11 under the gate electrode 31 is exposed. In FIG. 9, a part of the semiconductor material layer 11 exposed through the opening OP1 is hatched.

As illustrated in FIGS. 2A and 2B, an insulating film 22 forming the gate insulating film is formed over the entire surface including the interlayer insulating layer 21 and the opening OP1. The insulating film 22 is made of, for example, aluminum oxide ($Al_2O_3$) or hafnium oxide ($HfO_2$) having a thickness of about 10 nanometers, or a laminate thereof. A part of the insulating film 22 formed in the opening OP1 forms a gate insulating film 22A.

Figure 10:
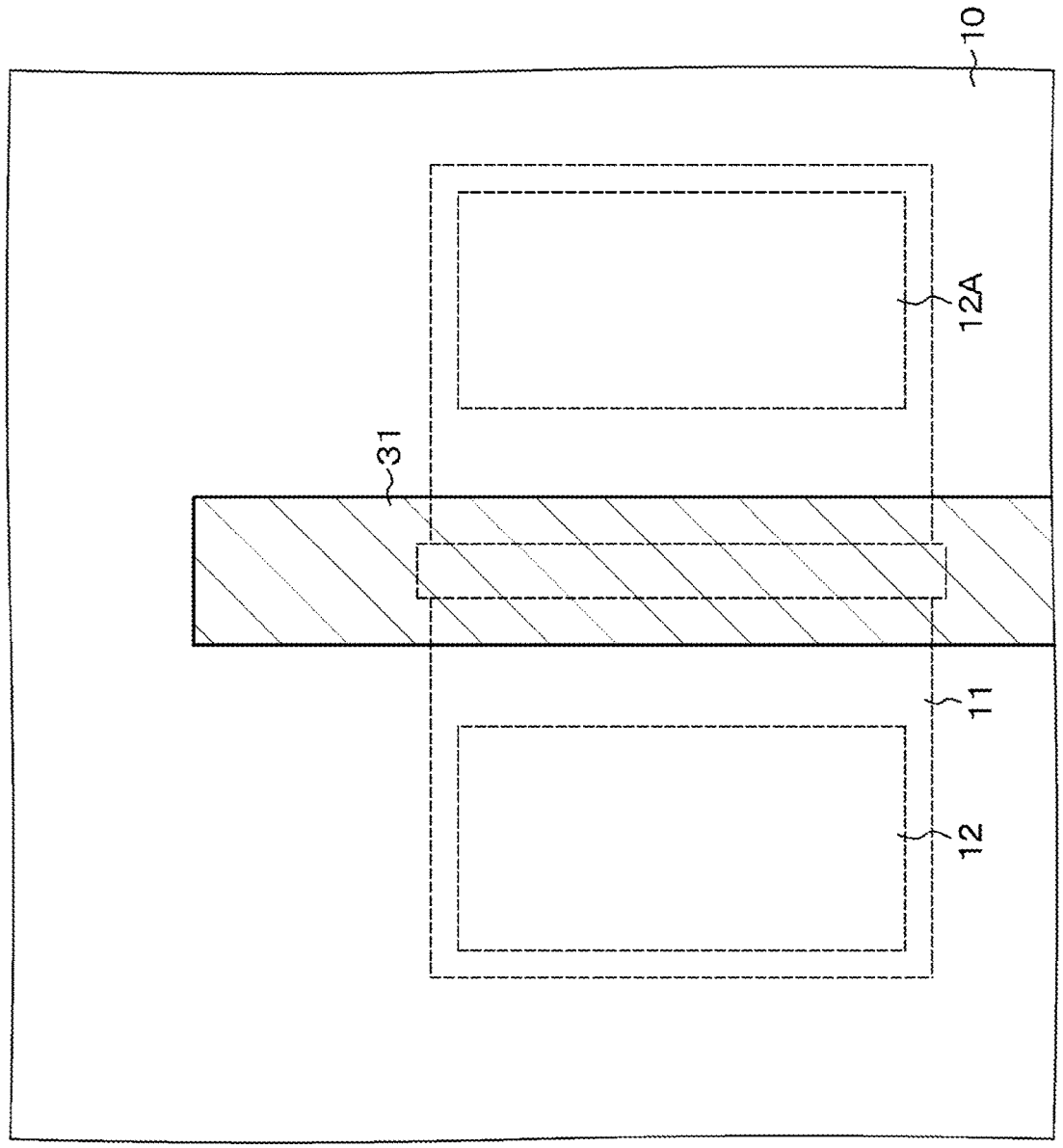
FIG. 10 is a schematic partial plan view for describing the method of manufacturing the semiconductor device according to the first embodiment of the present disclosure, which is continuous to FIG. 9.

Then, the gate electrode 31 is formed so as to cover the gate insulating film 22A formed in the opening OP1. As illustrated in FIG. 1, the gate electrode 31 is arranged between the pair of source/drain electrodes 12 and 12A, and is formed on the semiconductor material layer 11 via the gate insulating film 22A. In FIG. 10, the hatched part illustrates the planar shape of the gate electrode 31. The gate electrode 31 is made of, for example, a material similar to the conductive material forming the pair of source/drain electrodes 12 and 12A.

As illustrated in FIGS. 2A and 2B, an insulating planarization film 32 is formed on the entire surface including the gate electrode 31. On the planarization film 32, for example, a resistive element 41 formed by patterning a metal thin film are provided. An insulating film 42 is formed on the entire surface including the resistive element 41. In this manner, the resistive element 41 is arranged in an interlayer film formed on the semiconductor material layer 11.

Then, contacts 43 and 43A are formed so as to penetrate the insulating film 42, the planarization film 32, the insulating film 22, and the interlayer insulating layer 21. In addition, a contact 43B is formed so as to penetrate the insulating film 42 and the planarization film 32. The contacts 43 and 43A are formed so as to be connected to the source/drain electrodes 12 and 12A, respectively. In addition, the contact 43B is formed so as to be connected to the gate electrode 31.

In addition, contacts 44 and 44B are formed so as to penetrate the insulating film 42. Each of the contacts 44 and 44B is formed so as to be connected to the resistive element 41.

The wirings 53, 53A, and 53B are formed on the insulating film 42. The wirings 53, 53A, and 53B are formed by appropriately patterning conductive material layers formed in the same layer. The wirings 53, 53A and 53B are connected to the source/drain electrodes 12 and 12A and the gate electrode 31 via the above-described contacts 43, 43A and 43B, respectively.

In addition, the wiring 53 is connected to one end of the resistive element 41 via the above-described contact 44, and the wiring 53B is connected to the other end of the resistive element 41 via the above-described contact 44B. A protective film 54 is formed on the entire surface including the wirings 53, 53A, and 53B.

In the semiconductor device 1 formed as described above, a potential between a gate and a source and a potential between the gate and a drain become the same DC potential during a manufacturing process of the semiconductor device. Therefore, it is possible to prevent damage to the gate insulating film 22A due to an antenna effect.

Meanwhile, the influence on characteristics of the semiconductor device 1 can be sufficiently reduced by appropriately setting a size of the resistive element 41. Specifically, an impedance of the resistive element may be set to be larger than an internal impedance between the source/drain electrode and the gate electrode to which the resistive element is connected. The impedance of the resistive element 41 can be configured to be 1 kΩ or more, and more preferably, the impedance of the resistive element may be configured to be 1 MΩ or more.

Figure 3A:
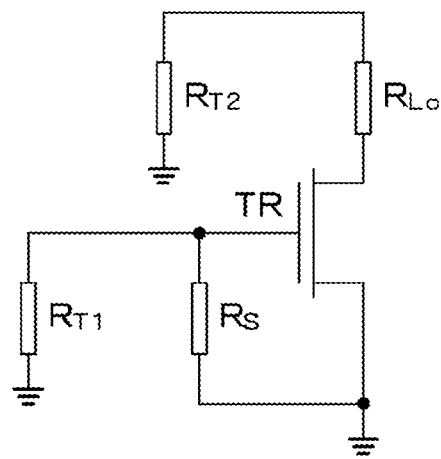
FIG. 3A is a model for a high-frequency small signal simulation of the semiconductor device according to the first embodiment of the present disclosure.
Figure 3B:
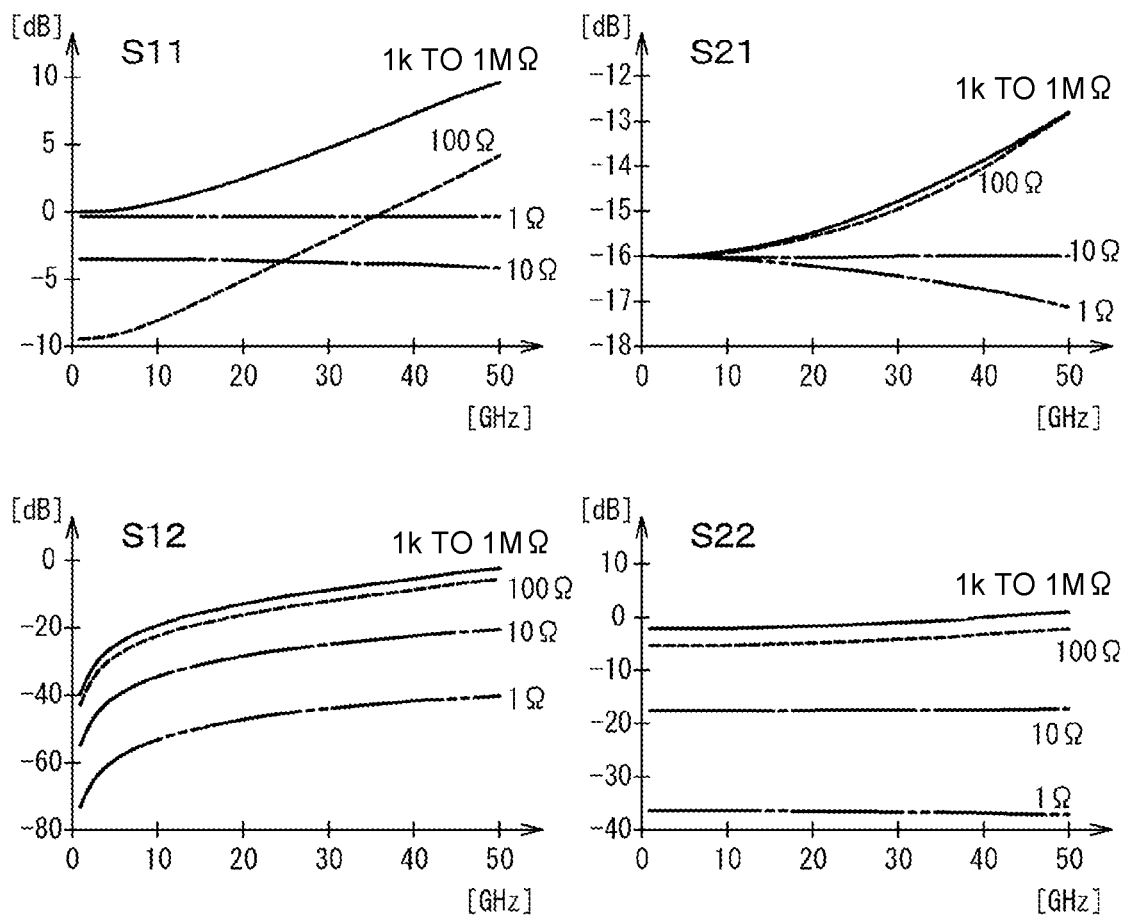
FIG. 3B is a graph illustrating a relationship between a value of a resistive element and an S parameter obtained by the simulation.

FIG. 3A is a model for a high-frequency small signal simulation of the semiconductor device according to the first embodiment of the present disclosure. FIG. 3B is a graph illustrating a relationship between a value of a resistive element and an S parameter obtained by the simulation.

In order to examine the influence on the characteristics of the semiconductor device 1, a high-frequency small signal simulation was performed using the model illustrated in FIG. 3A. Note that this circuit assumes a so-called power amplifier that amplifies a signal input to a gate electrode.

A general HEMT model was used as a transistor TR assuming a gate length of about 10 micrometers. Specifically, the circuit has a configuration in which a source side is connected to GND, a drain side is terminated with a resistor $R_{T2}$ of 50Ω via a load resistor $R_{Lo}$ of 50Ω and a resistor $R_{T1}$ of 50Ω is arranged between a gate and GND, and inputs a small signal to the gate. Since a depletion type transistor is used, a resistive element $R_S$ is connected only between the gate and the source.

FIG. 3B illustrates results of the small signal simulation performed with a size of the resistive element $R_S$ as a parameter. Specifically, graphs of S11 to S22 parameters were obtained by setting a value of the resistive element $R_S$ to 1Ω, 10Ω, 100Ω, 1 kΩ, and 1 MΩ. Note that a graph of a case without the resistive element $R_S$ generally overlapped with that of the case where the resistive element $R_S$ was 1 kΩ or 1 MΩ. Therefore, these graphs of the S11 to S22 parameters illustrate that small signal characteristics are substantially the same whether the resistive element $R_S$ is present or absent if a resistance value of the resistive element $R_S$ is at least 1 kΩ or more.

Figure 4A:
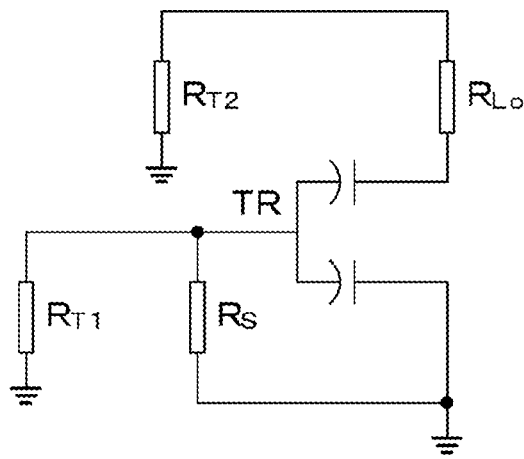
FIG. 4A is a simulation model for examining a relationship between an internal parameter and the resistive element of the semiconductor device according to the first embodiment of the present disclosure.
Figure 4B:
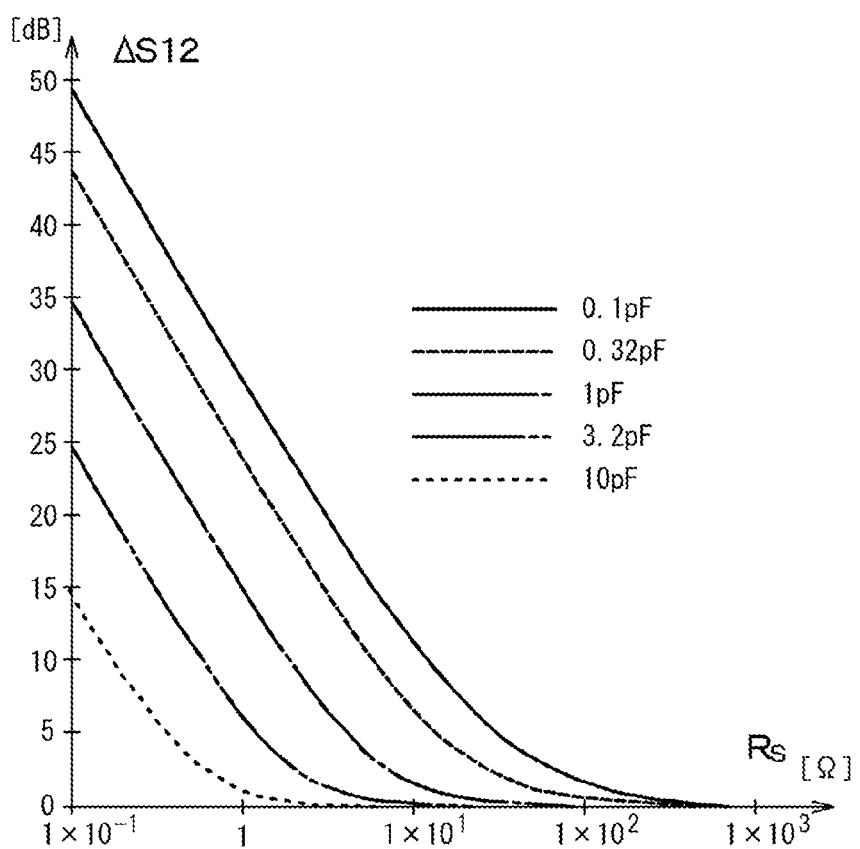
FIG. 4B is a graph illustrating a relationship between a value of the resistive element and a difference ($\Delta S12$) in an S12 parameter depending on the presence or absence of the resistive element, which is obtained by simulation.

Subsequently, a simulation was performed using a simple transistor model illustrated in FIG. 4A in order to examine a relationship between an internal parameter of the semiconductor device 1 and the resistive element $R_S$. First, a difference between S12 at the time of not using the resistive element $R_S$ and S12 at the time of using the resistive element $R_S$ was defined as ΔS12. Then, FIG. 4B illustrates each relationship between ΔS12 and $R_S$ when a capacitance value was set to 0.1 pF, 0.32 pF, 1 pF, 3.2 pF, and 10 pF. Here, if ΔS12 is sufficiently close to 0, for example, if the difference is within 1 dB, it can be determined that the influence of the resistive element $R_S$ on the characteristics of the semiconductor device 1 is extremely small.

Figure 5:
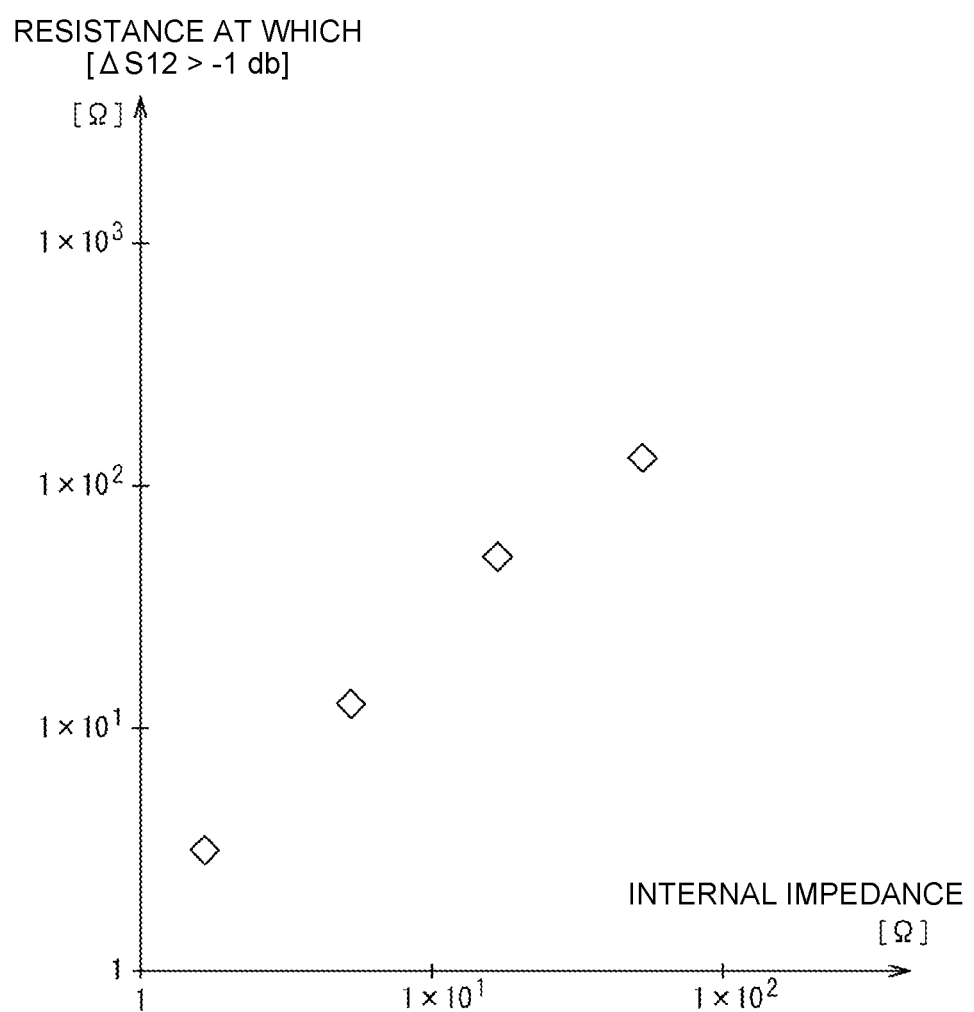
FIG. 5 is a graph illustrating a relationship between a resistance value at which $\Delta S12$ is smaller than 1 dB and an internal impedance defined as $\frac{1}{2}\,\omega C$.

FIG. 5 is a graph illustrating a relationship between a resistance value at which ΔS12 is smaller than 1 dB and an internal impedance defined as ½ΩC.

As the resistance value of the resistive element $R_S$ is set to be larger than the internal impedance of the transistor, ΔS12 becomes smaller than 1 dB. Therefore, it can be seen that the influence of the connection of the resistive element $R_S$ on the characteristics of the semiconductor device 1 is extremely small. In order to reduce the influence, it is desirable to set the resistance value of the resistive element $R_S$ to be larger than the internal impedance by one or more orders of magnitude.

Meanwhile, if a resistance is formed between a gate and a source, a DC leakage current adversely affects the device characteristics. Therefore, it is desirable that the resistance value of the resistive element $R_S$ be 1 kΩ or more, preferably 1 MΩ or more.

Next, a method of manufacturing the semiconductor device 1 will be described.

As described above, the method of manufacturing the semiconductor device 1 includes a step of connecting at least one of the pair of source/drain electrodes and the gate electrode via the resistive element.

FIGS. 6 to 13 are schematic partial plan views for describing the configuration of the semiconductor device according to the first embodiment of the present disclosure. Note that, in principle, an insulating layer and an insulating film are not indicated in the plan view from the viewpoint of readability.

Figure 6:
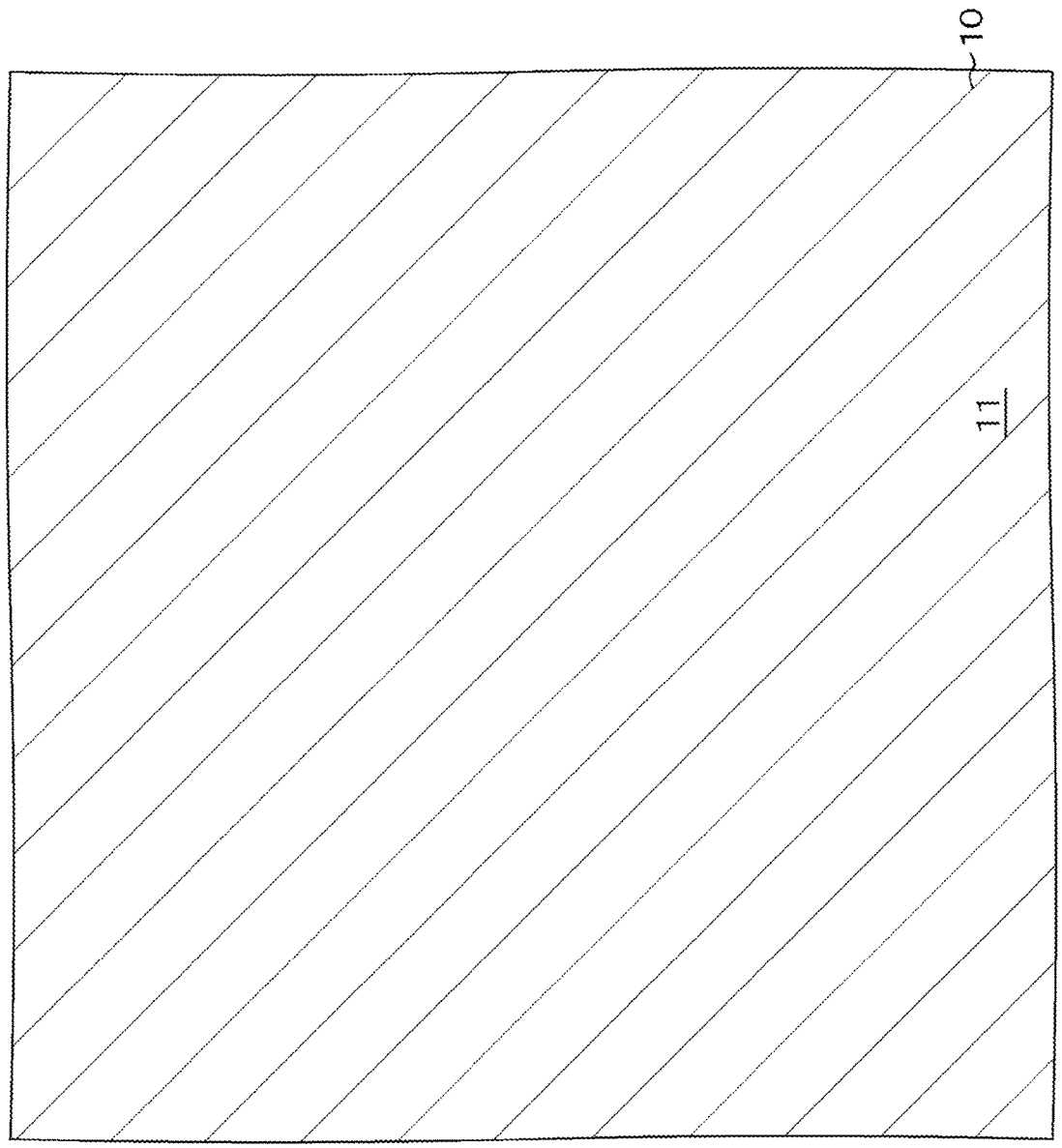
FIG. 6 is a schematic partial plan view for describing a method of manufacturing the semiconductor device according to the first embodiment of the present disclosure.

[Step-100] (see FIGS. 6 and 7)

First, the semiconductor material layer 11 is formed on the semiconductor substrate 10. Specifically, the semiconductor substrate 10 is prepared, and an epitaxial growth layer of gallium nitride (GaN) is formed as the semiconductor material layer 11 on the entire surface (see FIG. 6). Thereafter, a part excluding a channel formation region and an active region, which is to form a source/drain region, is defined as the element isolation region 11A. Specifically, boron ions are implanted into a part, which needs to be an element isolation region, by an ion implantation method to form the element isolation region 11A, thereby forming a region of the semiconductor material layer 11 surrounded by the element isolation region 11A (see FIG. 7).

[Step-110] (see FIG. 8)

Next, the source/drain electrodes 12 and 12A are formed. Specifically, a conductive material layer made of a metal material is formed on the entire surface including the semiconductor material layer 11. Thereafter, the source/drain electrodes 12 and 12A are formed at predetermined positions by a patterning method.

[Step-120] (see FIG. 9)

Next, the interlayer insulating layer 21 is formed on the entire surface. Thereafter, the opening OP1 is provided through which a part of the semiconductor material layer 11 located under the gate electrode 31 is exposed.

[Step-130] (see FIG. 10)

Next, the insulating film 22 forming the gate insulating film 22A and the like is formed on the entire surface. Thereafter, the gate electrode 31 is formed. Specifically, a conductive material layer made of a metal material is formed on the entire surface, and then, the gate electrode 31 is formed at a predetermined position using a well-known patterning method.

Figure 11:
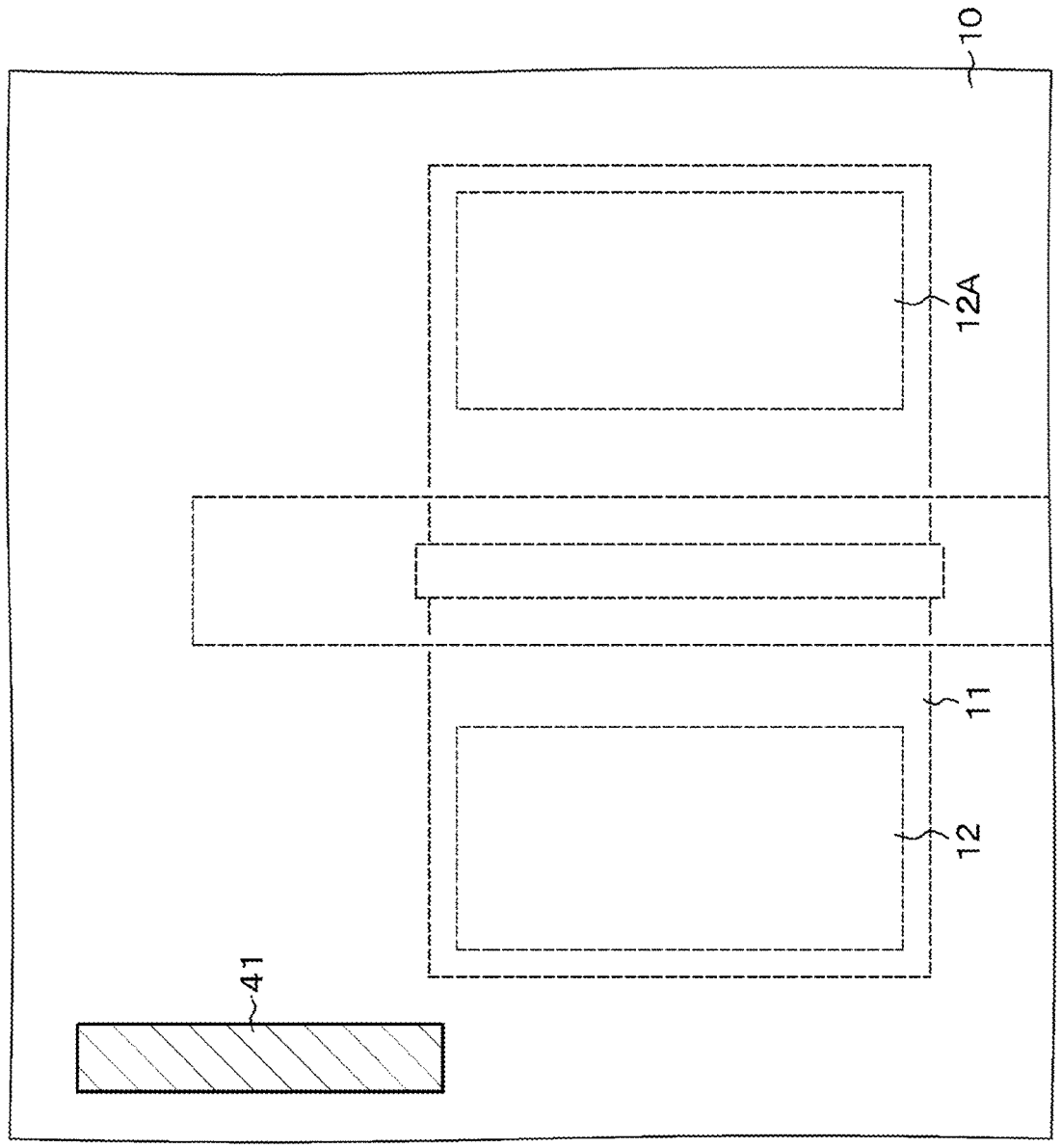
FIG. 11 is a schematic partial plan view for describing the method of manufacturing the semiconductor device according to the first embodiment of the present disclosure, which is continuous to FIG. 10.
Figure 12:
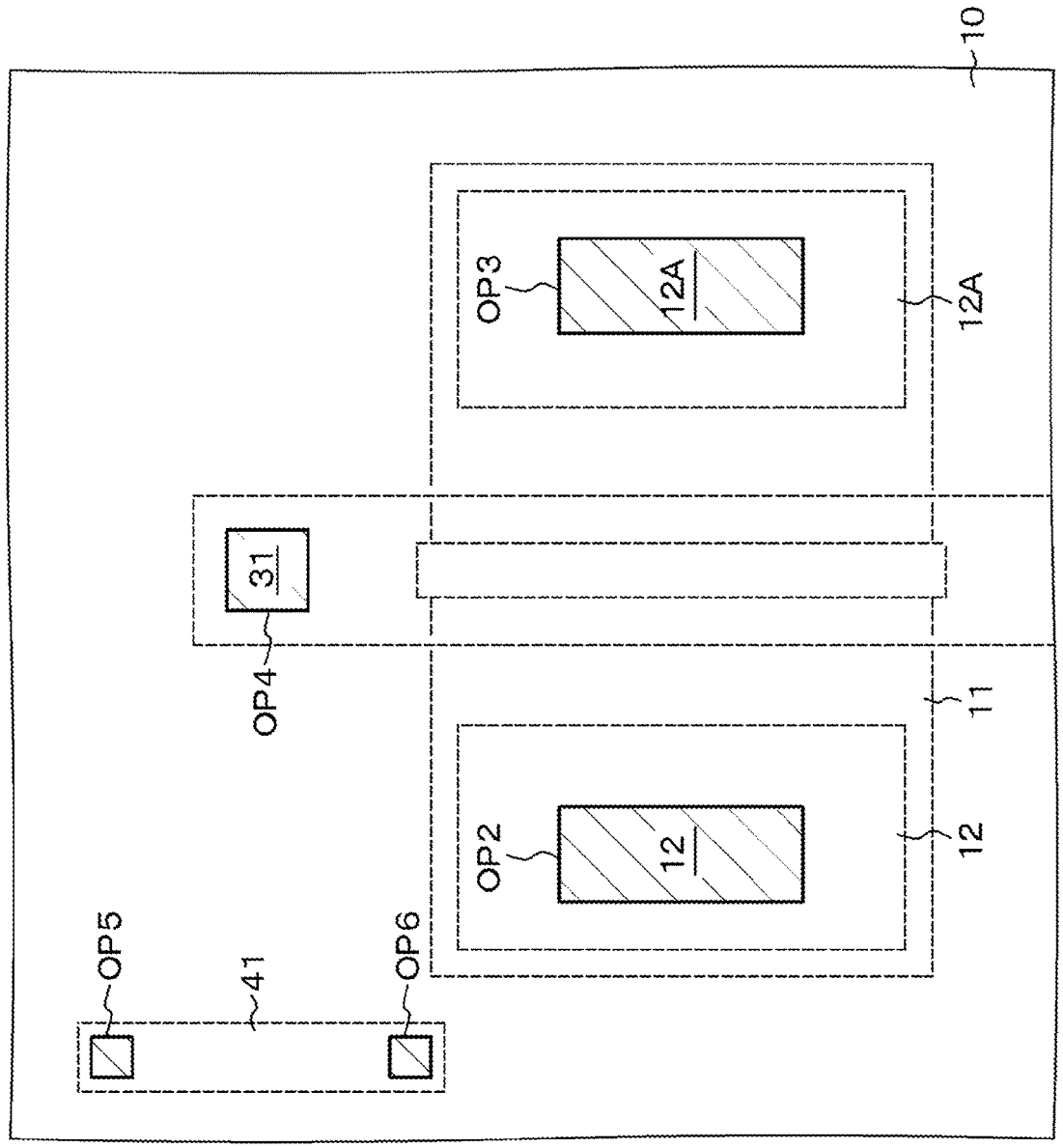
FIG. 12 is a schematic partial plan view for describing the method of manufacturing the semiconductor device according to the first embodiment of the present disclosure, which is continuous to FIG. 11.

[Step-140] (see FIGS. 11 and 12)

Thereafter, the insulating planarization film 32 is formed on the entire surface including the gate electrode 31. Next, the resistive element 41 is formed. Specifically, a thin film made of a metal material is formed on the entire surface, and then, the resistive element 41 is formed at a predetermined position using a well-known patterning method (see FIG. 11). Thereafter, the insulating film 42 is formed on the entire surface. Next, openings OP2, OP3, OP4, OP5, and OP6 are provided in parts corresponding to the contacts 43, 43A, 43B, 44, and 44B, respectively (see FIG. 12).

Figure 13:
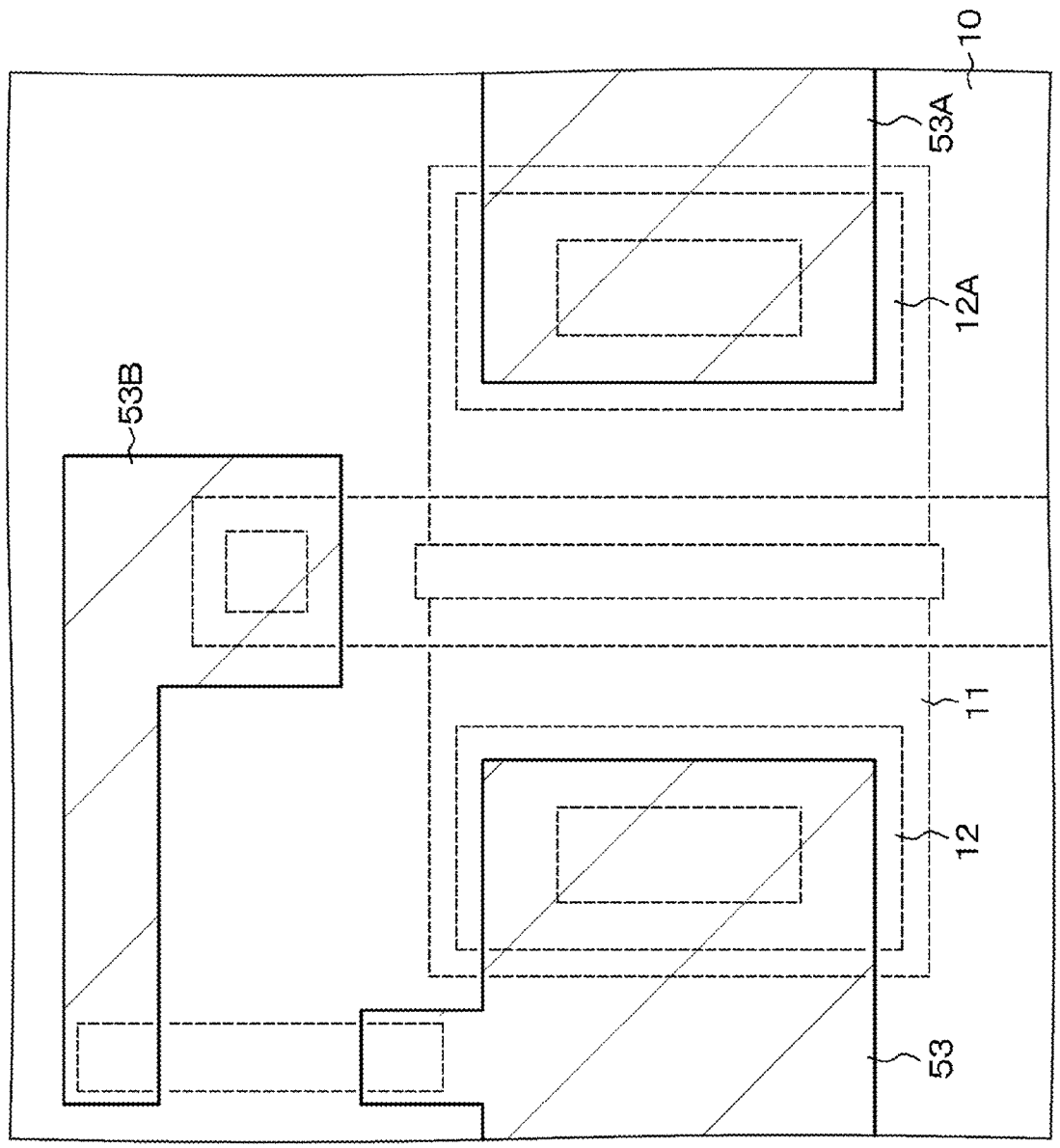
FIG. 13 is a schematic partial plan view for describing the method of manufacturing the semiconductor device according to the first embodiment of the present disclosure, which is continuous to FIG. 12.

[Step-150] (see FIG. 13)

Thereafter, the openings OP2, OP3, OP4, OP5, and OP6 are filled with a conductive material to form contacts, and then, the wirings 53, 53A, and 53B are formed. Specifically, a conductive material layer made of a metal material is formed on the entire surface, and then, the wirings 53, 53A, and 53B are formed at predetermined positions using a well-known patterning method. Thereafter, the protective film 54 is formed on the entire surface.

The semiconductor device 1 can be manufactured by the above steps.

In the above description, the resistive element 41 is arranged in the interlayer film formed on the semiconductor material layer 11. However, the configuration of the resistive element 41 is not limited thereto. For example, the resistive element 41 can be also configured using a semiconductor material layer formed in the same layer as the semiconductor material layer 11 forming the channel layer. As an example, a shape of the semiconductor material layer can be defined by the element isolation region 11A illustrated in FIG. 7, and a resistive element having a predetermined resistance value can be formed.

[First Modification]

Various modifications can be made regarding the first embodiment. A first modification of the first embodiment will be described.

FIG. 14 is a schematic partial plan view for describing a configuration of a semiconductor device according to the first modification of the first embodiment of the present disclosure.

In the semiconductor device 1 illustrated in FIG. 1, only the source/drain electrode 12A out of the pair and the gate electrode 31 are connected via the resistive element 41. On the other hand, a semiconductor device 1A according to the first modification has a difference that both the source/drain electrode 12 and the gate electrode 31 and the source/drain electrode 12A and the gate electrode 31 are connected via the resistive elements 41.

The semiconductor device 1A according to the first modification has a configuration suitable for an enhancement type transistor in which a source and a drain are separated in a state where a bias voltage is not applied to a gate electrode. That is, even in the enhancement type transistor, a potential between the gate and the source and a potential between the gate and the drain are the same DC potential during a manufacturing process of the semiconductor device. Therefore, it is possible to prevent damage to the gate insulating film 22A due to an antenna effect.

The semiconductor device 1A is different from the semiconductor device 1 illustrated in FIG. 1 in terms of a planar shape of a wiring layer 53 or the like and the resistive elements 41 provided at two locations, and basically has a similar configuration as that of the semiconductor device 1. Therefore, the description of the semiconductor device 1 may be read as appropriate.

[Second Modification]

A second modification of the first embodiment will be described.

Figure 15A:
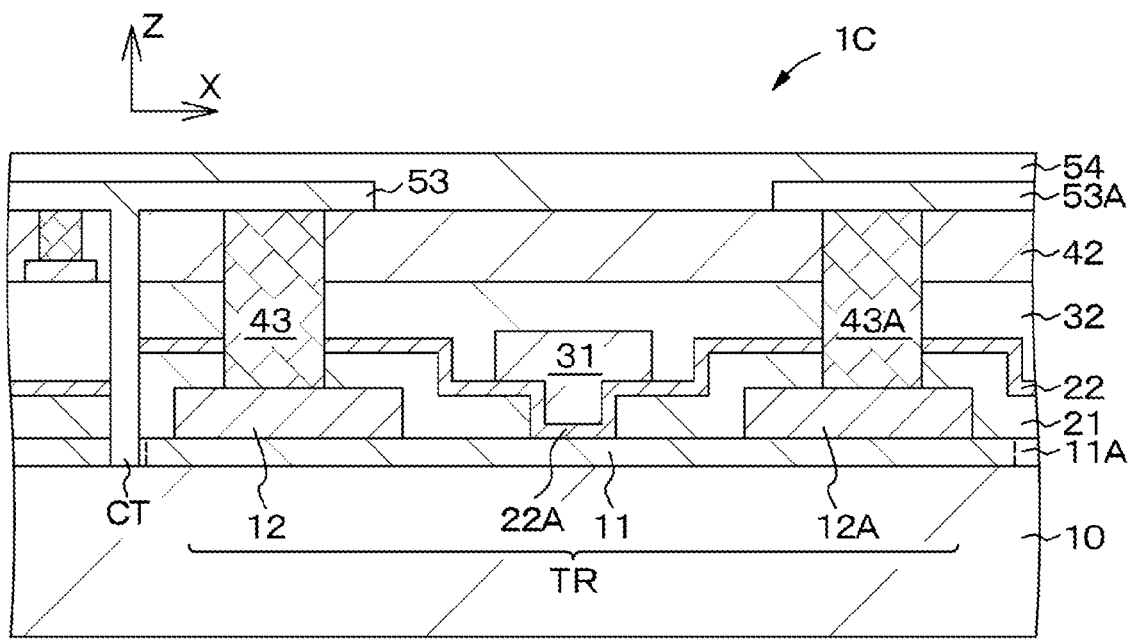
FIGS. 15A and 15B are schematic partial cross-sectional views for describing a configuration of a semiconductor device according to a second modification of the first embodiment of the present disclosure.
Figure 15B:
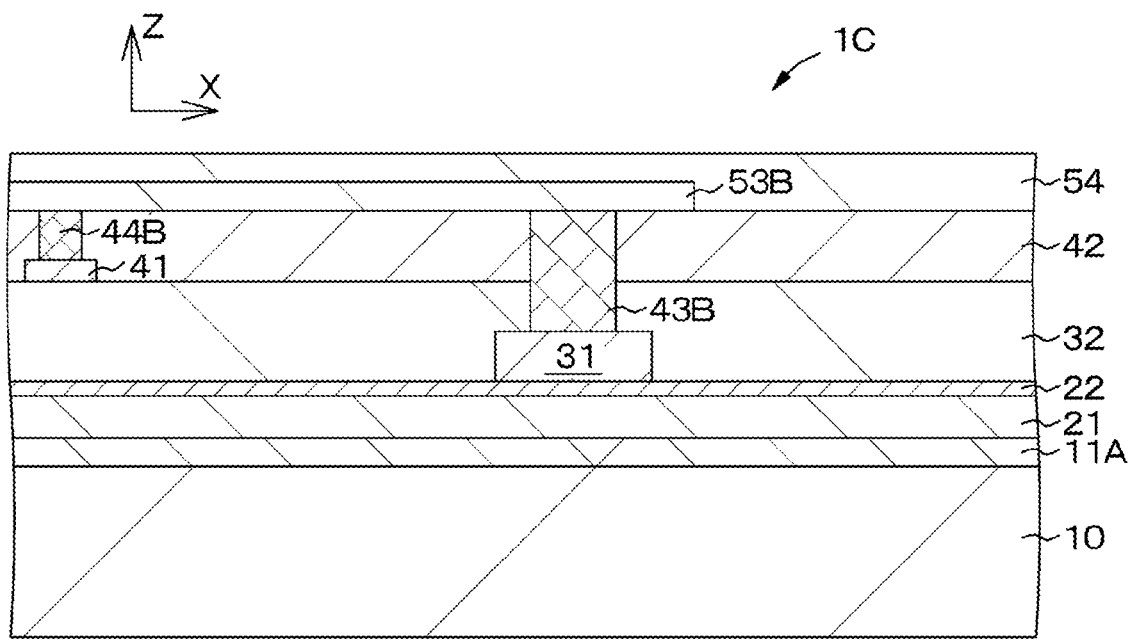

FIGS. 15A and 15B are schematic partial cross-sectional views for describing a configuration of a semiconductor device according to the second modification of the first embodiment of the present disclosure.

In FIG. 9 referred to in the first embodiment, the interlayer insulating layer 21 is provided with the opening OP1 through which the semiconductor material layer 11 under the gate electrode 31 is exposed. The opening OP1 is usually formed by dry etching, but it is considered that the exposed semiconductor material layer 11 is damaged at that time.

A semiconductor device 1B according to the second modification has a configuration capable of reducing the above-described damage. Specifically, the interlayer insulating layer 21 of the semiconductor material layer 11 has a two-layer structure including a lower layer 21A and an upper layer 21B. Then, the upper layer 21B is processed by dry etching and the lower layer 21A is processed by wet etching so as not to expose the surface of the semiconductor material layer 11 during the dry etching, thereby reducing the damage caused by the etching.

The semiconductor device 1B is different from the semiconductor device 1 illustrated in FIG. 1 in terms of the above-described points, and basically has a similar configuration as that of the semiconductor device 1. Therefore, the description of the semiconductor device 1 may be read as appropriate.

[Third Modification]

Next, a third modification of the first embodiment will be described.

Figure 16A:
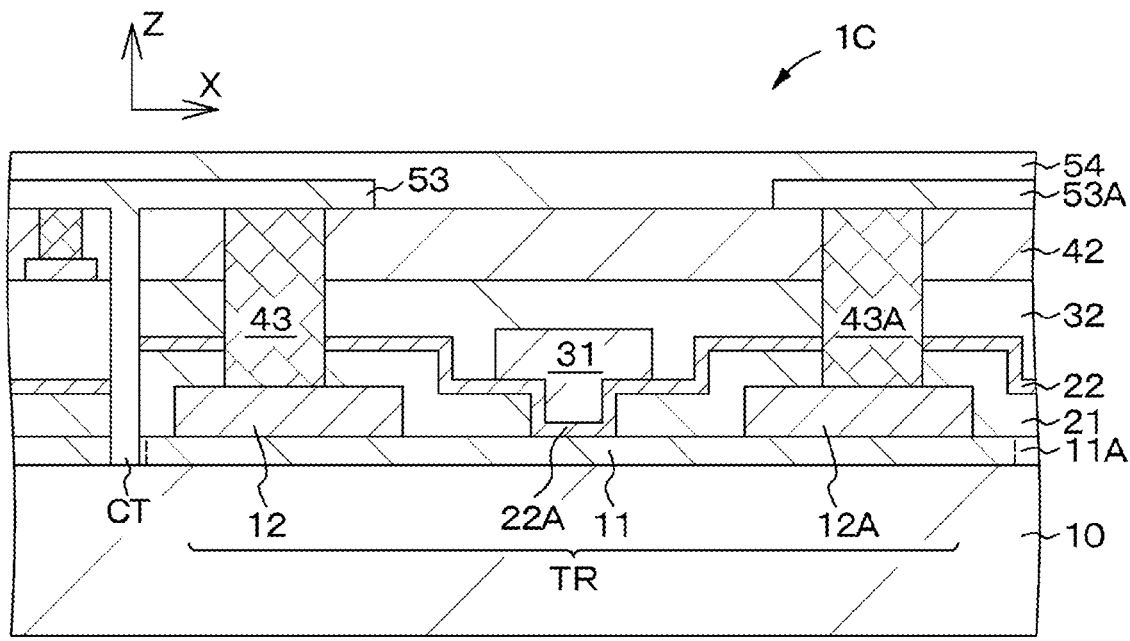
FIGS. 16A and 16B are schematic partial cross-sectional views for describing a configuration of a semiconductor device according to a third modification of the first embodiment of the present disclosure.
Figure 16B:
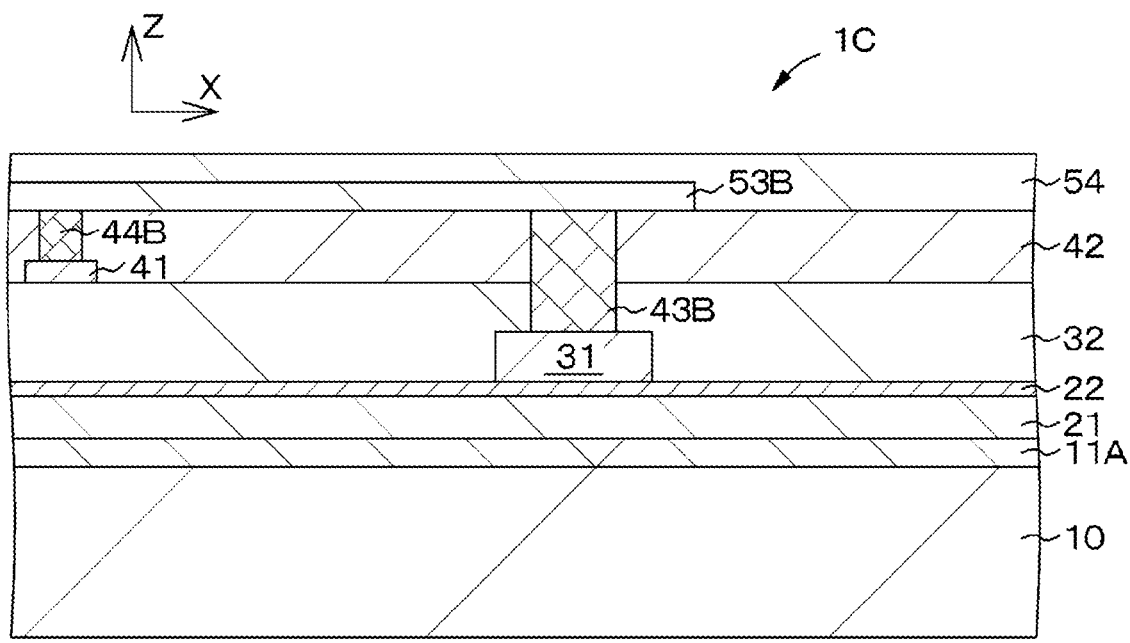

FIGS. 16A and 16B are schematic partial cross-sectional views for describing a configuration of a semiconductor device according to the third modification of the first embodiment of the present disclosure.

In a semiconductor device 1C according to the third modification, a semiconductor material layer is formed on a semiconductor substrate, and a source/drain electrode to which a resistive element is connected and the semiconductor substrate are connected.

Specifically, the semiconductor device 1C is different from the semiconductor device 1 in that one source/drain electrode 12 is also connected to the semiconductor substrate 10 via the wiring 53 and a contact CT. According to this configuration, charge accumulated in a gate electrode and the pair of source/drain electrodes can be made to flow toward the semiconductor substrate 10.

The semiconductor device 1C is different from the semiconductor device 1 illustrated in FIG. 1 in terms of the above-described points, and basically has a similar configuration as that of the semiconductor device 1. Therefore, the description of the semiconductor device 1 may be read as appropriate.

In the semiconductor device according to the present disclosure described above, PID in a manufacturing process such as etching using plasma can be reduced, and a process step of removing a wiring before shipment of the semiconductor device is not required. In addition, the influence on the characteristics of the semiconductor device can also be made sufficiently small.

[Description of Electronic Device]

The semiconductor device of the present disclosure can be used for, for example, an electronic device constituting a wireless communication device or the like in a moving object communication system or the like. In particular, it is suitable for use as an RF switch and a power amplifier. That is, it is possible to achieve a high speed, a high efficiency, and low power consumption in wireless communication by using the semiconductor device of the present disclosure having excellent high frequency characteristics and high efficiency characteristics for the RF switch and the power amplifier of the wireless communication device. In particular, the high speed, high efficiency, and low power consumption enables the extension of use time in a portable communication terminal so that the convenience can be further improved.

Figure 17:
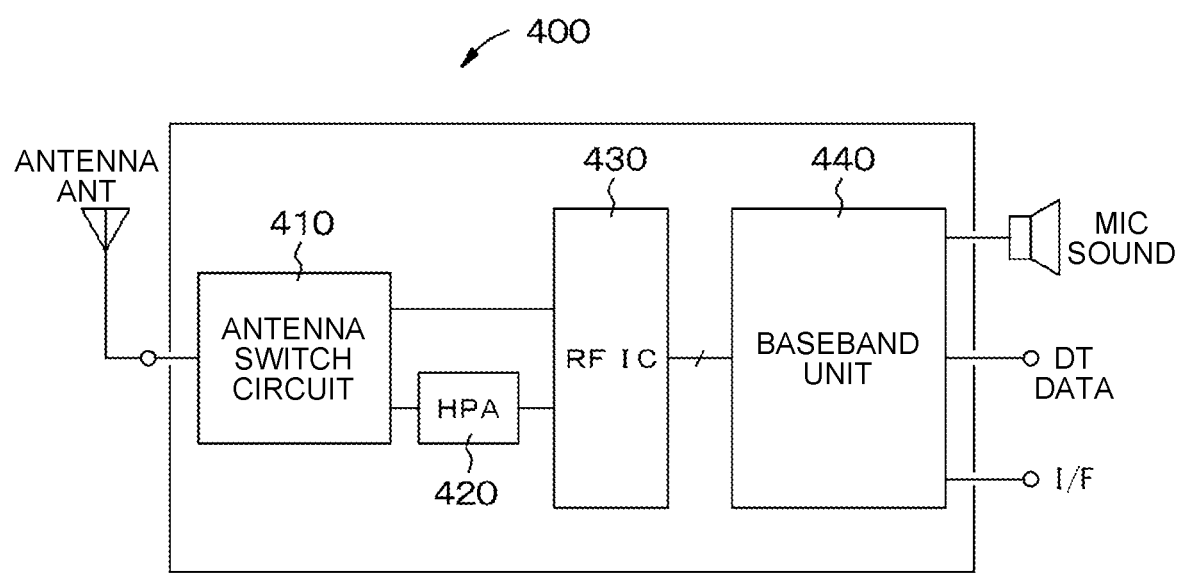
FIG. 17 is a schematic configuration diagram for describing a configuration of a wireless communication device using a semiconductor device according to the present disclosure.

FIG. 17 illustrates an example of the electronic device constituting the wireless communication device. An electronic device 400 is, for example, a mobile phone system having multiple functions such as sound, data communication, and LAN connection. The electronic device 400 includes, for example, an antenna ANT, an antenna switch circuit 410, a high-power amplifier (HPA) 420, a radio frequency integrated circuit RFIC 430, a baseband unit 440, a sound output unit MIC, a data output unit DT, and an interface unit I/F (for example, a wireless LAN (W-LAN: Wireless Local Area Network), Bluetooth (registered trademark), or the like). The radio frequency integrated circuit RFIC 430 and the baseband unit 440 are connected by the interface unit I/F.

At the time of transmission of the electronic device 400, that is, when a transmission signal is output from a transmission system of the electronic device 400 to the antenna ANT, the transmission signal output from the baseband unit 440 is output to the antenna ANT via the radio frequency integrated circuit RFIC 430, the high-power amplifier (HPA) 420, and the antenna switch circuit 410.

In addition, at the time of reception, that is, when a signal received by the antenna ANT is input to a reception system of the electronic device 400, the received signal is input to the baseband unit 440 via the antenna switch circuit 410 and the radio frequency integrated circuit RFIC 430. The signal processed by the baseband unit 440 is output from output units such as the sound output unit MIC, the data output unit DT, and the interface unit I/F.

APPLICATION EXAMPLES

The technology according to the present disclosure can be applied to various products. For example, the technology according to the present disclosure may be achieved as a device mounted on a moving object of any type such as a vehicle, an electric vehicle, a hybrid electric vehicle, a motorcycle, a bicycle, a personal mobility, an airplane, a drone, a ship, a robot, a construction machine, and an agricultural machine (tractor).

Figure 18:
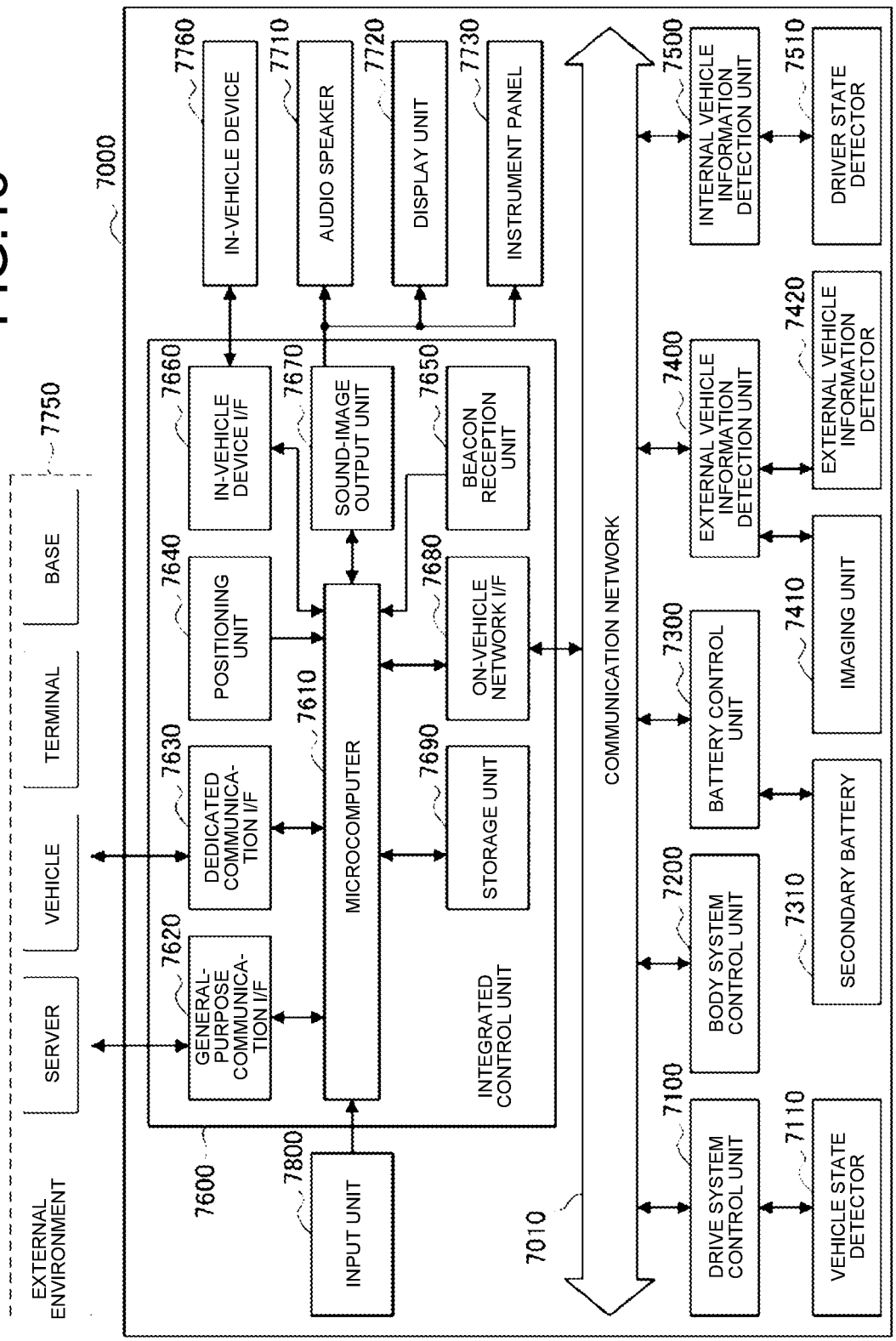
FIG. 18 is a block diagram illustrating an example of a schematic configuration of a vehicle control system.

FIG. 18 is a block diagram illustrating a schematic configuration example of a vehicle control system 7000, which is an example of a moving object control system to which the technology according to the present disclosure can be applied. A vehicle control system 7000 includes a plurality of electronic control units connected via a communication network 7010. In the example illustrated in FIG. 18, the vehicle control system 7000 includes a drive system control unit 7100, a body system control unit 7200, a battery control unit 7300, an external vehicle information detection unit 7400, an internal vehicle information detection unit 7500, and an integrated control unit 7600. The communication network 7010 connecting the plurality of control units may be, for example, an on-vehicle communication network conforming to an arbitrary standard such as a controller area network (CAN), a local interconnect network (LIN), a local area network (LAN), and FlexRay (registered trademark).

Each of the control units includes: a microcomputer that performs arithmetic processing according to various programs; a storage unit that stores the programs executed by the microcomputer, parameters used for various operations, or the like; and a drive circuit that drives various devices to be controlled. Each of the control units includes a network I/F configured to communicate with another control unit via the communication network 7010, and a communication I/F configured to perform communication by wired communication or wireless communication with a device, a sensor, or the like inside or outside the vehicle. As functional configurations of the integrated control unit 7600, a microcomputer 7610, a general-purpose communication I/F 7620, a dedicated communication I/F 7630, a positioning unit 7640, a beacon reception unit 7650, an in-vehicle device I/F 7660, a sound-image output unit 7670, an on-vehicle network I/F 7680, and a storage unit 7690 are illustrated in FIG. 18. The other control units similarly include the microcomputer, the communication I/F, the storage unit, and the like.

The drive system control unit 7100 controls operations of devices related to a drive system of a vehicle according to various programs. For example, the drive system control unit 7100 functions as a control device of a driving force generation device, such as an internal combustion engine and a driving motor, configured to generate a driving force of the vehicle, a driving force transmitting mechanism configured to transmit the driving force to wheels, a steering mechanism that adjusts a steering angle of the vehicle, a braking device that generates a braking force of the vehicle, and the like. The drive system control unit 7100 may have a function as a control device such as an antilock brake system (ABS) and electronic stability control (ESC).

The drive system control unit 7100 is connected with a vehicle state detector 7110. The vehicle state detector 7110 includes, for example, a gyro sensor that detects an angular velocity of axial rotation motion of a vehicle body, an acceleration sensor that detects the acceleration of the vehicle, or at least one of sensors configured to detect an operation amount of an accelerator pedal, an operation amount of a brake pedal, a steering angle of a steering wheel, an engine speed, a wheel rotation speed, and the like. The drive system control unit 7100 performs arithmetic processing using a signal input from the vehicle state detector 7110, and controls an internal combustion engine, a driving motor, an electric power steering device, a brake device, or the like.

The body system control unit 7200 controls operations of various devices mounted on a vehicle body according to various programs. For example, the body system control unit 7200 functions as a control device of a keyless entry system, a smart key system, a power window device, or various lamps such as a head lamp, a back lamp, a brake lamp, a turn signal, and a fog lamp. In this case, the body system control unit 7200 can receive input of radio waves transmitted from a portable device substituted for a key or signals of various switches. The body system control unit 7200 receives input of these radio waves or signals to control a door lock device, the power window device, the lamps, or the like of the vehicle.

The battery control unit 7300 controls a secondary battery 7310, which is a power supply source of the driving motor, according to various programs. For example, information, such as a battery temperature, a battery output voltage, or a remaining capacity of a battery, is input to the battery control unit 7300 from a battery device including the secondary battery 7310. The battery control unit 7300 performs arithmetic processing using these signals, and performs temperature adjustment control of the secondary battery 7310 or control of a cooling device or the like included in the battery device.

The external vehicle information detection unit 7400 detects information regarding the outside of the vehicle on which the vehicle control system 7000 is mounted. For example, at least one of an imaging unit 7410 and an external vehicle information detector 7420 is connected to the external vehicle information detection unit 7400. The imaging unit 7410 includes at least one of a time of flight (ToF) camera, a stereo camera, a monocular camera, an infrared camera, and other cameras. The external vehicle information detector 7420 includes, for example, an environmental sensor configured to detect current climate or weather, or at least one of surrounding information detection sensors configured to detect another vehicle, an obstacle, a pedestrian, or the like around the vehicle on which the vehicle control system 7000 is mounted.

The environment sensor may be, for example, at least one of a raindrop sensor that detects rainy weather, a fog sensor that detects fog, a sunshine sensor that detects a degree of sunshine, and a snow sensor that detects snowfall. The surrounding information detection sensor may be at least one of an ultrasonic sensor, a radar device, and a light detection and ranging or laser imaging detection and ranging (LIDAR) device. The imaging unit 7410 and the external vehicle information detector 7420 may be provided as independent sensors or devices, or may be provided as a device in which a plurality of sensors or devices are integrated.

Figure 19:
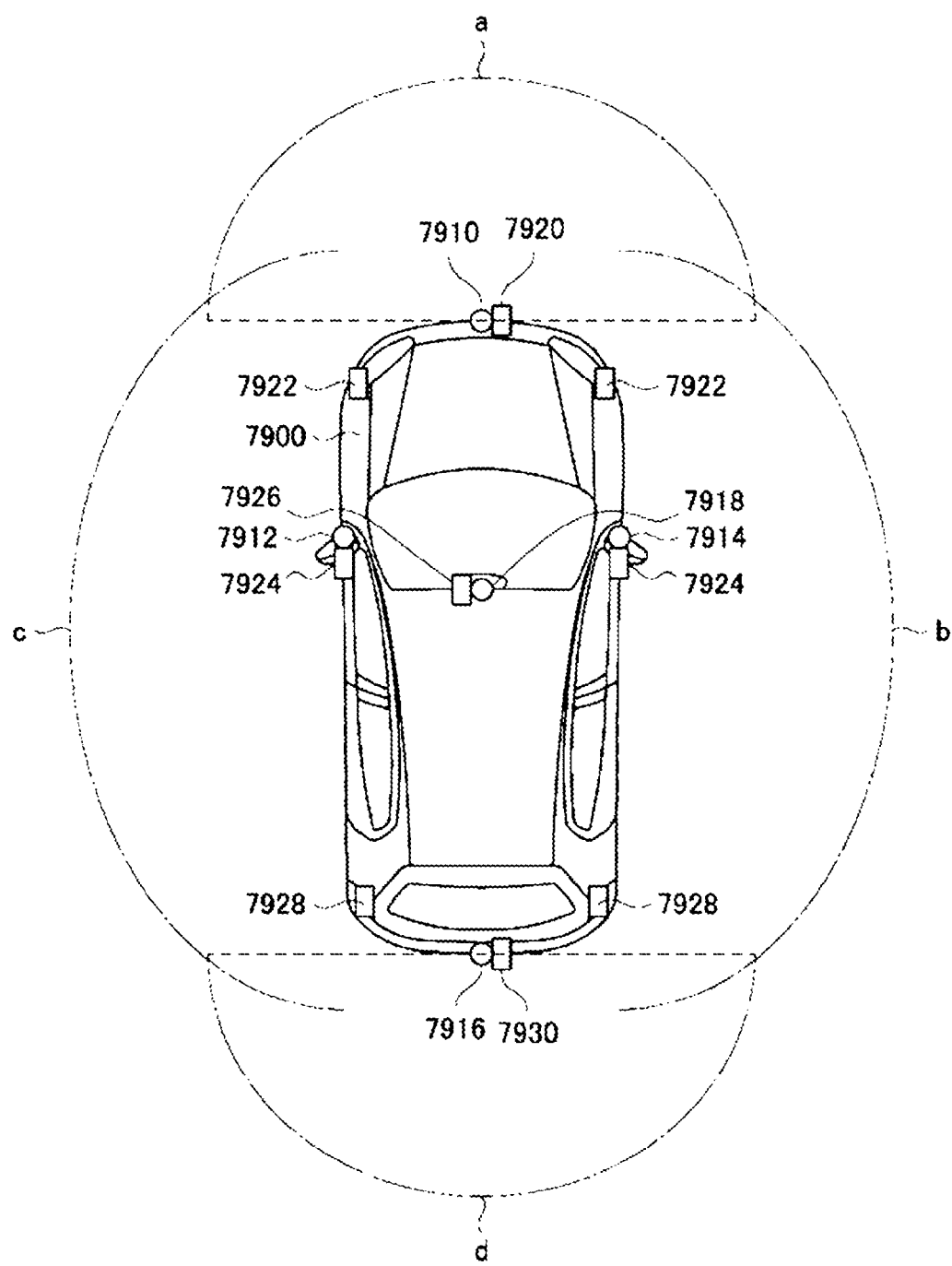
FIG. 19 is an explanatory diagram illustrating exemplary installation positions of an external vehicle information detector and an imaging unit.

Here, FIG. 19 illustrates exemplary installation positions of the imaging unit 7410 and the external vehicle information detector 7420. The imaging unit 7910, 7912, 7914, 7916, or 7918 is installed at at least one position of a front nose, side mirrors, a rear bumper, a back door, and an upper part of a windshield in a passenger compartment of a vehicle 7900, for example. The imaging unit 7910 installed at the front nose and the imaging unit 7918 installed in the upper part of the windshield in the passenger compartment mainly acquire an image of an area in front of the vehicle 7900. The imaging units 7912 and 7914 installed on the side mirrors mainly acquire images of the sides of the vehicle 7900. The imaging unit 7916 installed on the rear bumper or the back door mainly acquires an image of an area behind the vehicle

7900. The imaging unit 7918 provided in the upper part of the windshield in the passenger compartment is mainly used to detect a preceding vehicle or a pedestrian, an obstacle, a traffic light, a traffic sign, a lane, or the like.

Note that FIG. 19 illustrates exemplary imaging ranges of the respective imaging units 7910, 7912, 7914, and 7916. An imaging range a indicates an imaging range of the imaging unit 7910 provided on the front nose, imaging ranges b and c indicate imaging ranges of the imaging units 7912 and 7914 provided on the side mirrors, respectively, and an imaging range d indicates an imaging range of the imaging unit 7916 provided on the rear bumper or the back door. For example, a bird's-eye view image of the vehicle 7900 viewed from above can be obtained by superimposing image data captured by the imaging units 7910, 7912, 7914, and 7916.

External vehicle information detectors 7920, 7922, 7924, 7926, 7928, and 7930 provided at the front, rear, sides, corners, and the upper part of the windshield in the passenger compartment of the vehicle 7900 may be, for example, ultrasonic sensors or radar devices. The external vehicle information detectors 7920, 7926, and 7930 provided at the front nose, the rear bumper, the back door, and the upper part of the windshield in the passenger compartment of the vehicle 7900 may be, for example, LIDAR devices. These external vehicle information detectors 7920 to 7930 are mainly used to detect a preceding vehicle, a pedestrian, an obstacle, or the like.

Returning to FIG. 18, the description will be continued. The external vehicle information detection unit 7400 causes the imaging unit 7410 to capture an image of the outside of the vehicle and receives captured image data. In addition, the external vehicle information detection unit 7400 receives detection information from the connected external vehicle information detector 7420. In a case where the external vehicle information detector 7420 is an ultrasonic sensor, a radar device, or a LIDAR device, the external vehicle information detection unit 7400 transmits ultrasonic waves, electromagnetic waves, or the like, and receives information of received reflected waves. The external vehicle information detection unit 7400 may perform object detection processing or distance detection processing of a person, a car, an obstacle, a sign, a character on a road surface, or the like based on the received information. The external vehicle information detection unit 7400 may perform environment recognition processing of recognizing rainfall, fog, a road surface condition, or the like based on the received information. The external vehicle information detection unit 7400 may calculate a distance to an object outside the car based on the received information.

In addition, the external vehicle information detection unit 7400 may perform image recognition processing or distance detection processing for recognizing a person, a car, an obstacle, a sign, a character on a road surface, or the like based on the received image data. The external vehicle information detection unit 7400 may perform processing such as distortion correction and alignment on the received image data, and combine pieces of image data captured by the different imaging units 7410 to generate a bird's-eye view image or a panoramic image. The external vehicle information detection unit 7400 may perform viewpoint conversion processing using pieces of image data captured by the different imaging units 7410.

The internal vehicle information detection unit 7500 detects internal vehicle information. The internal vehicle information detection unit 7500 is connected with a driver state detector 7510 that detects a condition of a driver, for example. The driver state detector 7510 may include a camera that images a driver, a biometric sensor that detects biometric information of the driver, a microphone that collects sound in the passenger compartment, or the like. The biometric sensor is provided, for example, on a seat surface, a steering wheel, or the like, and detects biometric information of the occupant sitting on the seat or a driver gripping the steering wheel. The internal vehicle information detection unit 7500 may calculate a degree of fatigue or a degree of concentration of the driver or may determine whether the driver is dozing off based on detection information input from the driver state detector 7510. The internal vehicle information detection unit 7500 may perform processing such as noise canceling processing on a collected sound signal.

The integrated control unit 7600 controls the overall operation in the vehicle control system 7000 according to various programs. The integrated control unit 7600 is connected with an input unit 7800. The input unit 7800 is achieved by, for example, a device that can be operated by the occupant for input, such as a touch panel, a button, a microphone, a switch, and a lever. Data obtained by performing sound recognition on sound input by the microphone may be input to the integrated control unit 7600. The input unit 7800 may be, for example, a remote control device using infrared rays or other radio waves, or an external connection device such as a mobile phone and a personal digital assistant (PDA) supporting the operation of the vehicle control system 7000. The input unit 7800 may be, for example, a camera. In such a case, the occupant can input information by gesture. Alternatively, data obtained by detecting a movement of a wearable device worn by the occupant may be input. Further, the input unit 7800 may include, for example, an input control circuit or the like that generates an input signal based on information input by the occupant or the like using the input unit 7800 and outputs the input signal to the integrated control unit 7600. The occupant or the like inputs various types of data to the vehicle control system 7000 and instructs a processing operation by operating the input unit 7800.

The storage unit 7690 may include a read only memory (ROM) that stores various programs to be executed by the microcomputer, and a random access memory (RAM) that stores various parameters, calculation results, sensor values, or the like. In addition, the storage unit 7690 may be achieved by a magnetic storage device such as a hard disc drive (HDD), a semiconductor storage device, an optical storage device, a magneto-optical storage device, or the like.

The general-purpose communication I/F 7620 is a general-purpose communication I/F that relays communication with various devices existing in an external environment 7750. The general-purpose communication I/F 7620 may be equipped with a cellular communication protocol such as global system of mobile communications (GSM) (registered trademark), WiMAX, long term evolution (LTE), and LTE-advanced (LTE-A), or another wireless communication protocol such as wireless LAN (also referred to as Wi-Fi (registered trademark)) and Bluetooth (registered trademark). The general-purpose communication I/F 7620 may be connected to, for example, a device (for example, an application server or a control server) existing on an external network (for example, the Internet, a cloud network, or a company-specific network) via a base station or an access point. In addition, for example, the general-purpose communication I/F 7620 may be connected to a terminal (for example, a terminal of a driver, a pedestrian, or a store, or a machine type communication (MTC) terminal) existing in the vicinity of the vehicle using the peer to peer (P2P) technology.

The dedicated communication I/F 7630 is a communication I/F that supports a communication protocol formulated for use in the vehicle. For example, the dedicated communication I/F 7630 may be equipped with a standard protocol such as wireless access in vehicle environment (WAVE), which is a combination of IEEE802.11p of a lower layer and IEEE1609 of an upper layer, dedicated short range communications (DSRC), and a cellular communication protocol. The dedicated communication I/F 7630 typically performs V2X communication which is a concept including one or more of vehicle to vehicle communication, vehicle to infrastructure communication, vehicle to home communication, and vehicle to pedestrian communication.

The positioning unit 7640 receives, for example, a global navigation satellite system (GNSS) signal from a GNSS satellite (for example, a global positioning system (GPS) signal from a GPS satellite), executes positioning, and generates position information including latitude, longitude, and altitude of the vehicle. Note that the positioning unit 7640 may identify a current position by exchanging signals with a wireless access point, or may acquire the position information from a terminal such as a mobile phone, a PHS, and a smartphone having a positioning function.

The beacon reception unit 7650 receives, for example, radio waves or electromagnetic waves transmitted from a wireless station or the like installed on a road, and acquires information such as a current position, congestion, a closed road, and a required time. Note that the function of the beacon reception unit 7650 may be included in the dedicated communication I/F 7630 described above.

The in-vehicle device I/F 7660 is a communication interface that relays connection between the microcomputer 7610 and various in-vehicle devices 7760 existing in the vehicle. The in-vehicle device I/F 7660 may establish wireless connection using a wireless communication protocol such as wireless LAN, Bluetooth (registered trademark), near field communication (NFC), and wireless USB (WUSB). In addition, the in-vehicle device I/F 7660 may establish wired connection such as universal serial bus (USB), high-definition multimedia interface (HDMI) (registered trademark), and mobile high-definition link (MHL) via a connection terminal (and a cable if necessary) (not illustrated). The in-vehicle device 7760 may include, for example, a mobile device or a wearable device possessed by the occupant, or at least one of information devices carried in or attached to the vehicle. In addition, the in-vehicle device 7760 may include a navigation device that searches for a route to an arbitrary destination. The in-vehicle device I/F 7660 exchanges a control signal or a data signal with these in-vehicle devices 7760.

The on-vehicle network I/F 7680 is an interface that relays communication between the microcomputer 7610 and the communication network 7010. The on-vehicle network I/F 7680 transmits and receives signals and the like in accordance with a predetermined protocol supported by the communication network 7010.

The microcomputer 7610 of the integrated control unit 7600 controls the vehicle control system 7000 according to the various programs based on information acquired via at least one of the general-purpose communication I/F 7620, the dedicated communication I/F 7630, the positioning unit 7640, the beacon reception unit 7650, the in-vehicle device I/F 7660, and the on-vehicle network I/F 7680. For example, the microcomputer 7610 may calculate a control target value of the driving force generation device, the steering mechanism, or the braking device based on the acquired information regarding the inside and outside of the vehicle, and output a control command to the drive system control unit 7100. For example, the microcomputer 7610 may perform cooperative control for the purpose of implementing a function of an advanced driver assistance system (ADAS) including collision avoidance or impact mitigation for the vehicle, travel following a vehicle ahead based on an inter-vehicle distance, constant speed travel, a vehicle collision warning, a warning for the vehicle deviating a lane, or the like. In addition, the microcomputer 7610 may perform cooperative control for the purpose of automated driving or the like with which the vehicle travels autonomously without depending on the driver's operation by controlling the driving force generation device, the steering mechanism, the braking device, or the like based on the acquired information regarding the surroundings of the vehicle.

The microcomputer 7610 may generate three-dimensional distance information between the vehicle and an object such as a peripheral structure and a person based on the information acquired via at least one of the general-purpose communication I/F 7620, the dedicated communication I/F 7630, the positioning unit 7640, the beacon reception unit 7650, the in-vehicle device I/F 7660, and the on-vehicle network I/F 7680, and create local map information including peripheral information of the current position of the vehicle. In addition, the microcomputer 7610 may predict danger such as a collision of the vehicle, approach of a pedestrian or the like, or entry into a closed road based on the acquired information, and generate a warning signal. The warning signal may be, for example, a signal for generating a warning sound or turning on a warning lamp.

The sound-image output unit 7670 transmits an output signal of at least one of a sound or an image to an output device that can visually or aurally provide notification of information to the occupant of the vehicle or the outside of the vehicle. In the example of FIG. 18, an audio speaker 7710, a display unit 7720, and an instrument panel 7730 are exemplified as the output device. The display unit 7720 may include at least one of an on-board display and a head-up display, for example. The display unit 7720 may have an augmented reality (AR) display function. The output device may be another device other than these devices, such as a wearable device, such as a headphone and an eyeglass-type display worn by the occupant, a projector, and a lamp. In a case where the output device is a display device, the display device visually displays results obtained by various processes performed by the microcomputer 7610 or information received from another control unit in various formats such as text, images, tables, and graphs. In addition, in a case where the output device is a sound output device, the sound output device converts an audio signal including reproduced sound data, acoustic data, or the like into an analog signal and aurally outputs the analog signal.

Note that at least two control units connected via the communication network 7010 may be integrated as one control unit in the example illustrated in FIG. 18. Alternatively, each of the control units may include a plurality of control units. Further, the vehicle control system 7000 may include another control unit (not illustrated). In addition, some or all of the functions performed by any of the control units may be provided to another control unit in the above description. That is, predetermined arithmetic processing may be performed by any control unit as long as information is transmitted and received via the communication network 7010. Similarly, a sensor or device connected to any of the control units may be connected to another control unit, and a plurality of control units may mutually transmit and receive detection information via the communication network 7010.

The technology according to the present disclosure can be applied to, for example, various devices that control communication among the configurations described above.

OTHERS

Note that the technology of the present disclosure can also have the following configurations.

[A1]
A semiconductor device including:
a semiconductor material layer forming a channel layer;
a pair of source/drain electrodes formed on the semiconductor material layer; and
a gate electrode arranged between the pair of source/drain electrodes and formed on the semiconductor material layer,
wherein at least one of the pair of source/drain electrodes and the gate electrode are connected via a resistive element.

[A2]
The semiconductor device according to [A1], wherein the gate electrode is formed on the semiconductor material layer via a gate insulating film.

[A3]
The semiconductor device according to [A2], wherein the semiconductor material layer has a barrier layer formed on the channel layer.

[A4]
The semiconductor device according to [A3], wherein the semiconductor material layer is made of a compound semiconductor material.

[A5]
The semiconductor device according to [A4], wherein the semiconductor material layer forming the channel layer is formed such that a two-dimensional electron gas layer exists in the channel layer under the gate electrode in a state where no voltage is applied to the pair of source/drain electrodes and the gate electrode.

[A6]
The semiconductor device according to any one of [A1] to [A5], wherein
an impedance of the resistive element is larger than an internal impedance between the source/drain electrode and the gate electrode to which the resistive element is connected.

[A7]
The semiconductor device according to [A6], wherein the impedance of the resistive element is 1 kΩ or more.

[A8]
The semiconductor device according to [A6], wherein the impedance of the resistive element is 1 MΩ or more.

[A9]
The semiconductor device according to any one of [A1] to [A8], wherein
the resistive element is arranged in an interlayer film formed on the semiconductor material layer.

[A10]
The semiconductor device according to any one of [A1] to [A8], wherein
the resistive element is configured using a semiconductor material layer formed in a layer identical to the semiconductor material layer forming the channel layer.

[A11]
The semiconductor device according to any one of [A1] to [A10], wherein
the semiconductor material layer is formed on a semiconductor substrate, and
the source/drain electrode to which the resistive element is connected and the semiconductor substrate are connected.

[B1]
An electronic device including a semiconductor device including:
a semiconductor material layer forming a channel layer;
a pair of source/drain electrodes formed on the semiconductor material layer; and
a gate electrode arranged between the pair of source/drain electrodes and formed on the semiconductor material layer,
wherein at least one of the pair of source/drain electrodes and the gate electrode being connected via a resistive element.

[B2]
The electronic device according to [B1], in which the gate electrode is formed on the semiconductor material layer via a gate insulating film.

[B3]
The electronic device according to [B2], in which the semiconductor material layer has a barrier layer formed on the channel layer.

[B4]
The electronic device according to [B3], in which the semiconductor material layer is made of a compound semiconductor material.

[B5]
The electronic device according to [B4], in which the semiconductor material layer forming the channel layer is formed such that a two-dimensional electron gas layer exists in the channel layer under the gate electrode in a state where no voltage is applied to the pair of source/drain electrodes and the gate electrode.

[B6]
The electronic device according to any one of [B1] to [B5], in which
an impedance of the resistive element is larger than an internal impedance between the source/drain electrode and the gate electrode to which the resistive element is connected.

[B7]
The electronic device according to [B6], in which the impedance of the resistive element is 1 kΩ or more.

[B8]
The electronic device according to [B6], in which the impedance of the resistive element is 1 MΩ or more.

[B9]
The electronic device according to any one of [B1] to [B8], in which
the resistive element is arranged in an interlayer film formed on the semiconductor material layer.

[B10]
The electronic device according to any one of [B1] to [B8], in which
the resistive element is configured using a semiconductor material layer formed in a layer identical to the semiconductor material layer forming the channel layer.

[B11]
The electronic device according to any one of [B1] to [B10], in which
the semiconductor material layer is formed on a semiconductor substrate, and the source/drain electrode to which the resistive element is connected and the semiconductor substrate are connected.

REFERENCE SIGNS LIST 1, 1A, 1B, 1C SEMICONDUCTOR DEVICE
10 SEMICONDUCTOR SUBSTRATE
11 SEMICONDUCTOR MATERIAL LAYER
11A ELEMENT ISOLATION REGION
12, 12A PAIR OF SOURCE/DRAIN ELECTRODES
12B RELAY WIRING
12C ONE ELECTRODE FORMING CAPACITOR
21 INTERLAYER INSULATING LAYER
22 INSULATING FILM FORMING GATE INSULATING FILM
22A GATE INSULATING FILM
31 GATE ELECTRODE
32 PLANARIZATION FILM
41 RESISTIVE ELEMENT
42 INSULATING FILM
43, 43A, 43B CONTACT
44, 44B CONTACT
53, 53A, 53B WIRING
54 PROTECTIVE FILM
400 ELECTRONIC DEVICE
410 ANTENNA SWITCH CIRCUIT
420 HIGH-POWER AMPLIFIER (HPA)
430 RADIO FREQUENCY INTEGRATED CIRCUIT RFIC
440 baseband unit
OP1 OPENING PROVIDED IN INTERLAYER INSULATING LAYER
OP2, OP3, OP4 OPENING PROVIDED IN PLANARIZATION FILM
OP5, OP6 OPENING PROVIDED IN INSULATING FILM
TR PORTION OF FIELD EFFECT TRANSISTOR HAVING INSULATED GATE STRUCTURE
$R_S$ RESISTIVE ELEMENT

The invention claimed is:

1. A semiconductor device, comprising:
a first semiconductor material layer including a channel layer;
a pair of source/drain electrodes on the first semiconductor material layer;
a gate electrode between the pair of source/drain electrodes, wherein the gate electrode is on the first semiconductor material layer;
an interlayer film on the first semiconductor material layer, the pair of source/drain electrodes and the gate electrode; and
a resistive element on the interlayer film, wherein
at least one source/drain electrode of the pair of source/drain electrodes is connected to the gate electrode via the resistive element.

2. The semiconductor device according to claim 1, further comprising a gate insulating film, wherein
the gate electrode is on the first semiconductor material layer via the gate insulating film.

3. The semiconductor device according to claim 2, wherein
the first semiconductor material layer further includes a barrier layer, and
the barrier layer is on the channel layer.

4. The semiconductor device according to claim 3, wherein the first semiconductor material layer includes a compound semiconductor material.

5. The semiconductor device according to claim 4, wherein,
in a state where no voltage is applied to the pair of source/drain electrodes and the gate electrode, a two-dimensional electron gas layer exists in the channel layer,
the two-dimensional electron gas layer exists in the channel layer based on the first semiconductor material layer, and
the two-dimensional electron gas layer is below the gate electrode.

6. The semiconductor device according to claim 1, wherein an impedance of the resistive element is larger than an internal impedance between the at least one source/drain electrode and the gate electrode.

7. The semiconductor device according to claim 6, wherein the impedance of the resistive element is at least 1 kΩ.

8. The semiconductor device according to claim 6, wherein the impedance of the resistive element is at least 1 MΩ.

9. The semiconductor device according to claim 1, wherein
the resistive element is configured using a second semiconductor material layer, and
the second semiconductor material layer is in a specific layer that is identical to the first semiconductor material layer.

10. The semiconductor device according to claim 1, further comprising a semiconductor substrate, wherein
the first semiconductor material layer is on the semiconductor substrate, and
the at least one source/drain electrode and the semiconductor substrate are connected.

11. An electronic device, including comprising:
a semiconductor device including:
a semiconductor material layer including a channel layer;
a pair of source/drain electrodes on the semiconductor material layer;
a gate electrode between the pair of source/drain electrodes, wherein the gate electrode is on the semiconductor material layer;
an interlayer film on the semiconductor material layer, the pair of source/drain electrodes and the gate electrode; and
a resistive element is on the interlayer film, wherein
at least one source/drain electrode of the pair of source/drain electrodes is connected to the gate electrode via the resistive element.

12. A semiconductor device, comprising:
a first semiconductor material layer including a channel layer;
a pair of source/drain electrodes on the first semiconductor material layer;
a gate electrode between the pair of source/drain electrodes, wherein the gate electrode is on the first semiconductor material layer; and
a resistive element, wherein
the resistive element is configured using a second semiconductor material layer, the resistive element is on an interlayer film wherein the interlayer film is formed on the channel layer, the pair of source/drain electrodes and the gate electrode, the second semiconductor material layer is in a specific layer that is identical to the first semiconductor material layer, and at least one source/drain electrode of the pair of source/drain electrodes is connected to the gate electrode via the resistive element.

\* \* \* \* \*